(12) United States Patent
Kito et al.

(10) Patent No.: US 6,867,450 B2
(45) Date of Patent: Mar. 15, 2005

(54) SEMICONDUCTOR MEMORY DEVICE WITH SURFACE STRAP AND METHOD OF FABRICATING THE SAME

(75) Inventors: Masaru Kito, Yokohama (JP); Ryota Katsumata, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/644,415

(22) Filed: Aug. 20, 2003

(65) Prior Publication Data

US 2004/0251485 A1 Dec. 16, 2004

(30) Foreign Application Priority Data

Jun. 11, 2003 (JP) .......................... 2003-166851

(51) Int. Cl.[7] ............................. H01L 27/108
(52) U.S. Cl. ................. 257/301; 257/618; 257/327
(58) Field of Search ................ 257/301, 618, 257/327

(56) References Cited

U.S. PATENT DOCUMENTS

| | | | |
|---|---|---|---|
| 6,664,582 B2 * | 12/2003 | Fried et al. | ................ 257/308 |
| 2002/0011612 A1 * | 1/2002 | Hieda | ........................ 257/262 |
| 2004/0150037 A1 | 8/2004 | Katsumata et al. | |
| 2004/0150071 A1 | 8/2004 | Kondo et al. | |

FOREIGN PATENT DOCUMENTS

JP  2002-118255  4/2002

* cited by examiner

Primary Examiner—David Nelms
Assistant Examiner—Tu-Tu Ho
(74) Attorney, Agent, or Firm—Frommer Lawrence & Haug LLP

(57) ABSTRACT

A semiconductor memory device includes memory cells each having a trench capacitor and a fin-gate-type MOSFET that selects the trench capacitor. One of activation regions of the MOSFET, which are provided in a pillar, and one of electrodes of the trench capacitor are electrically connected by a surface strap. The surface strap contacts an upper surface and an upper part of a side wall of the pillar.

6 Claims, 30 Drawing Sheets

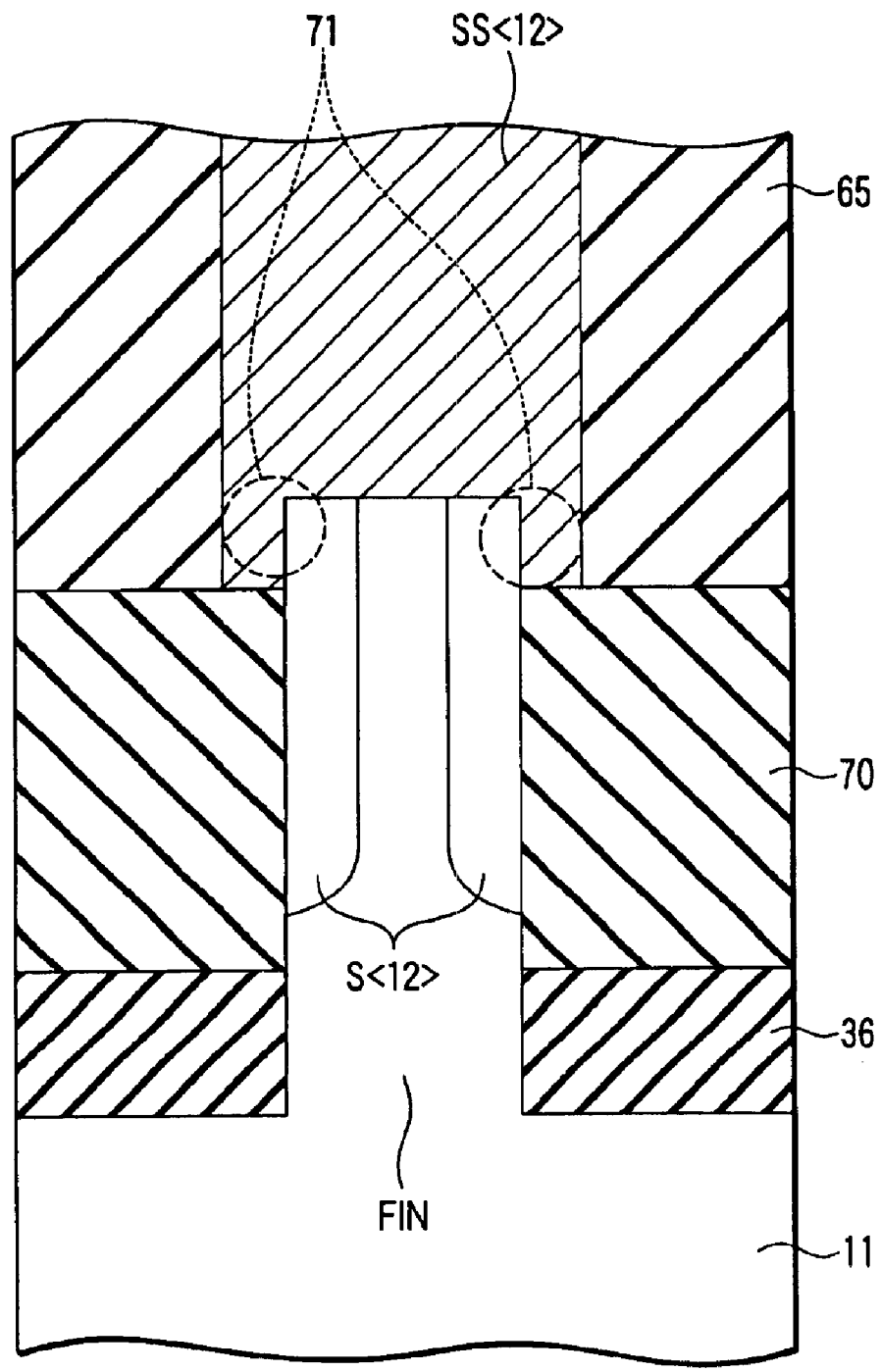
F I G. 7

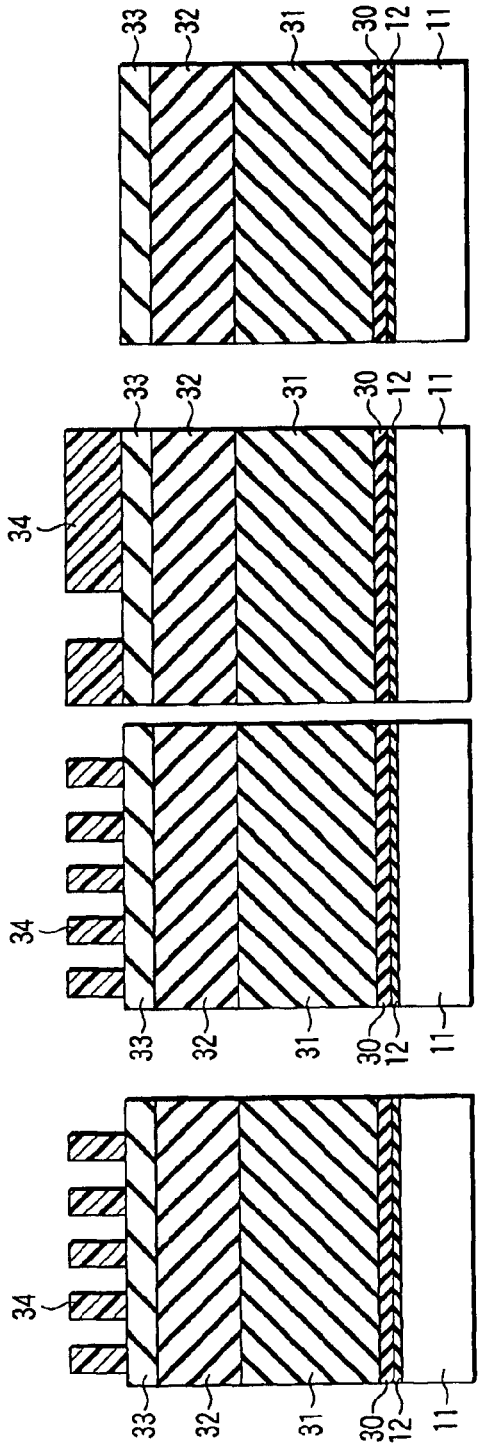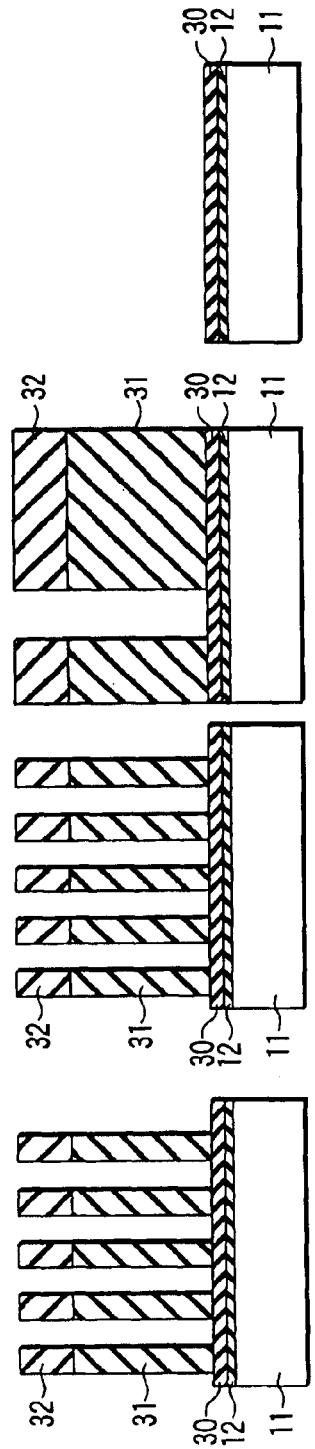

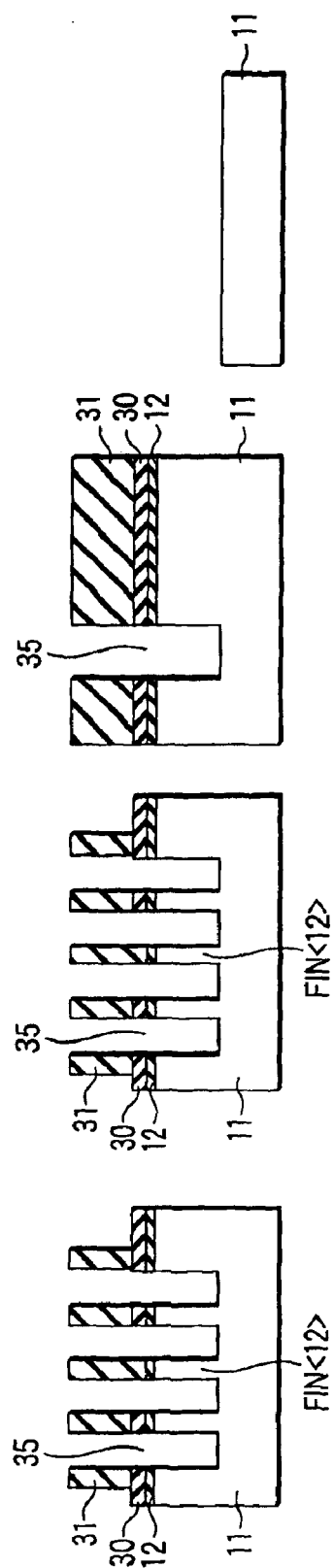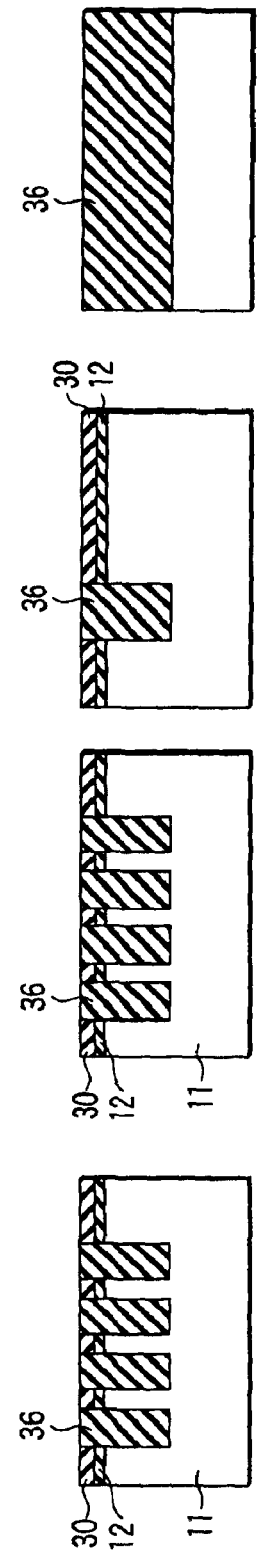

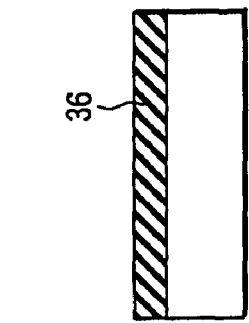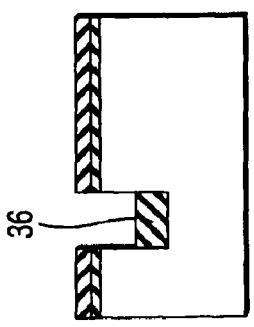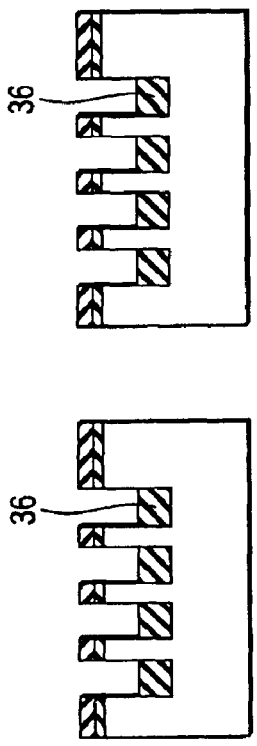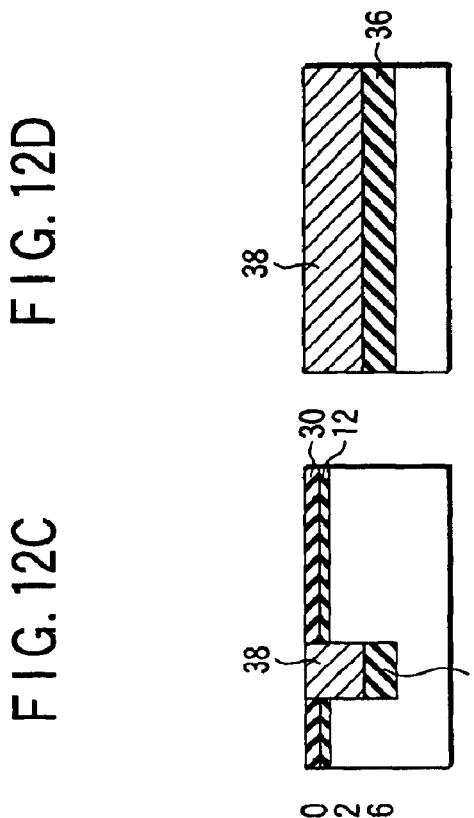

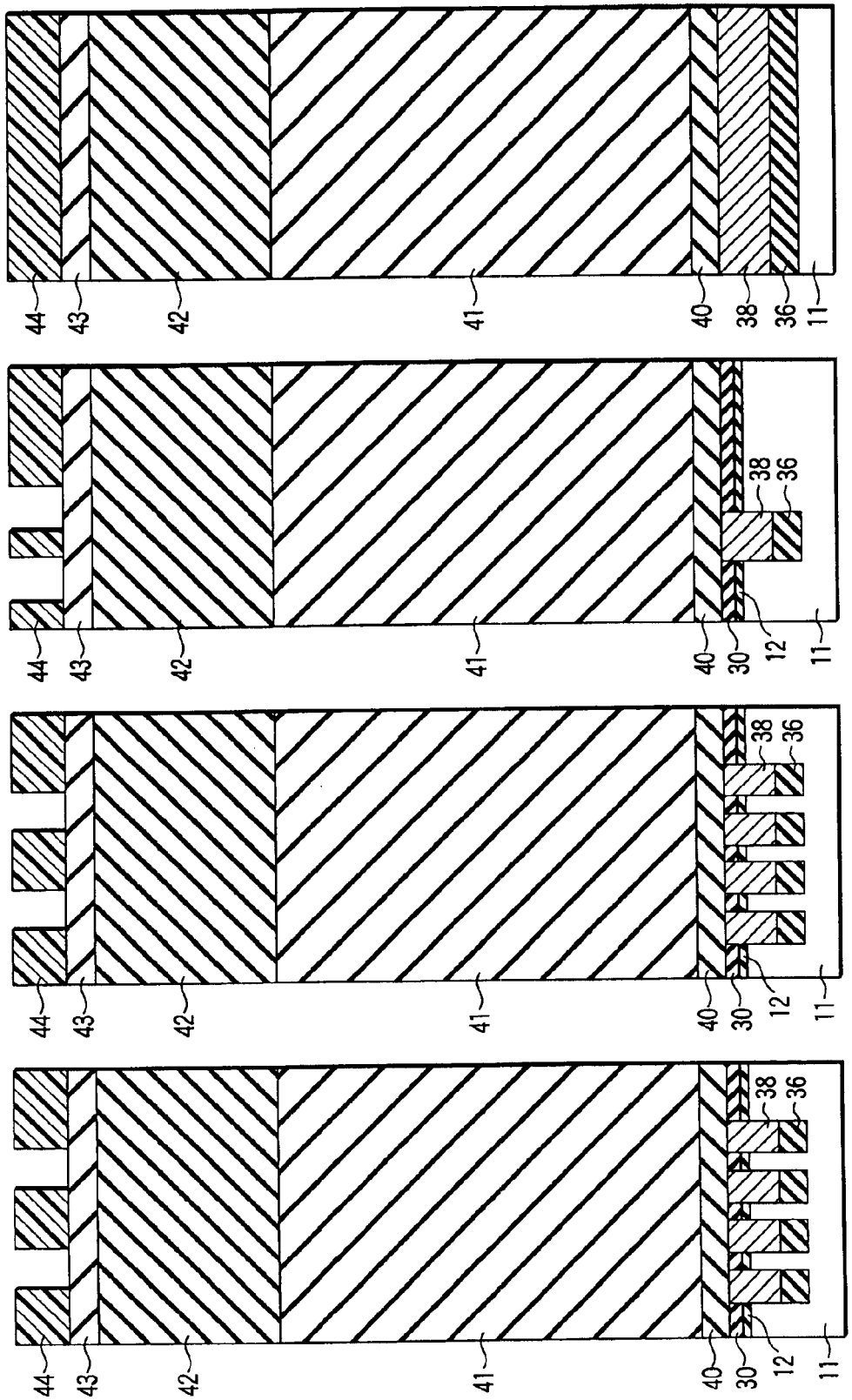

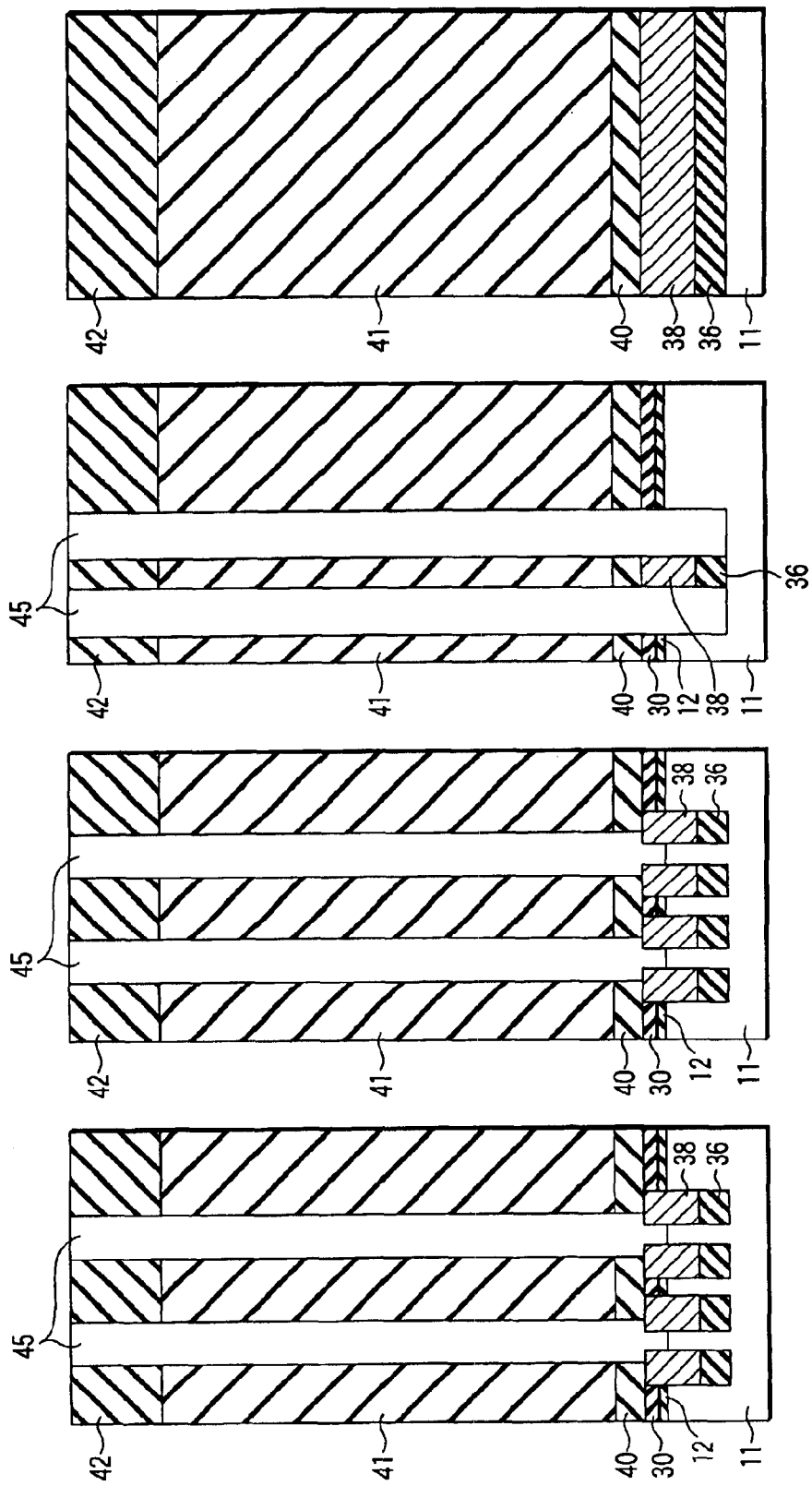

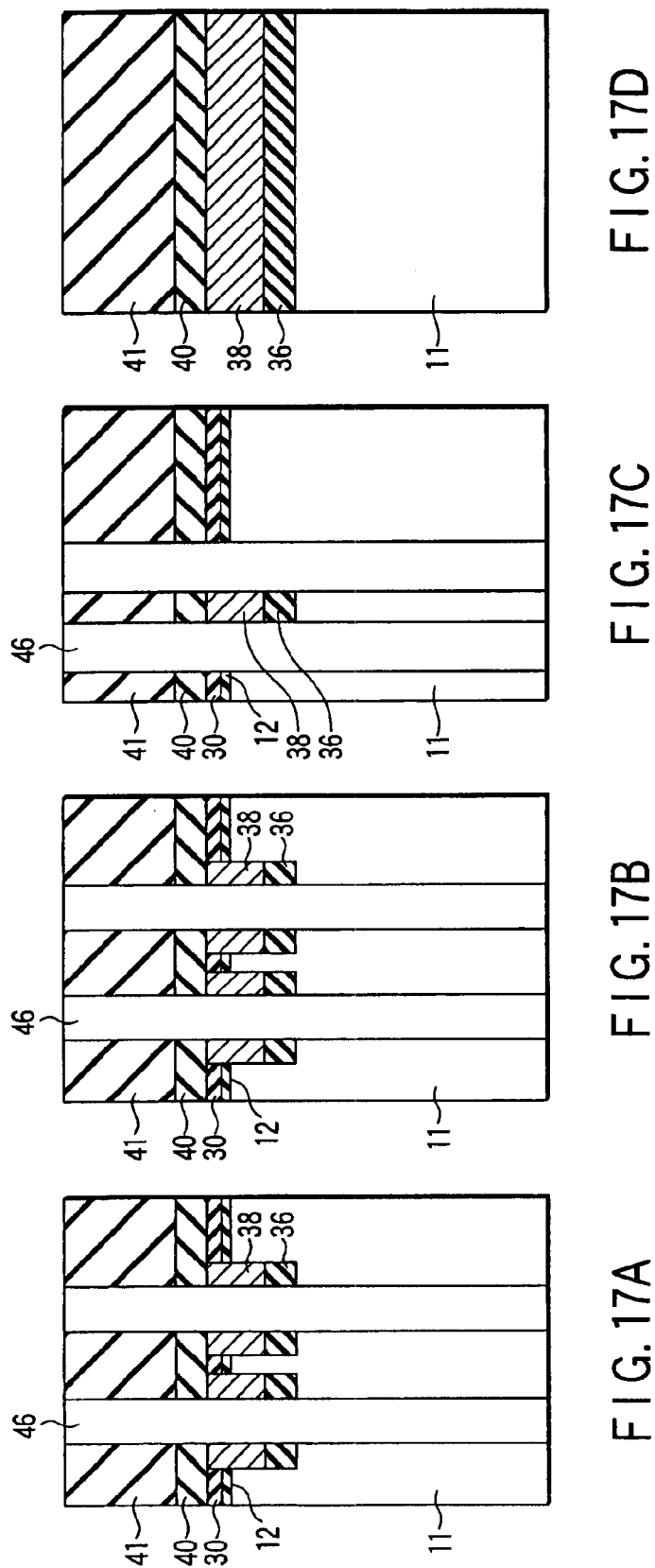

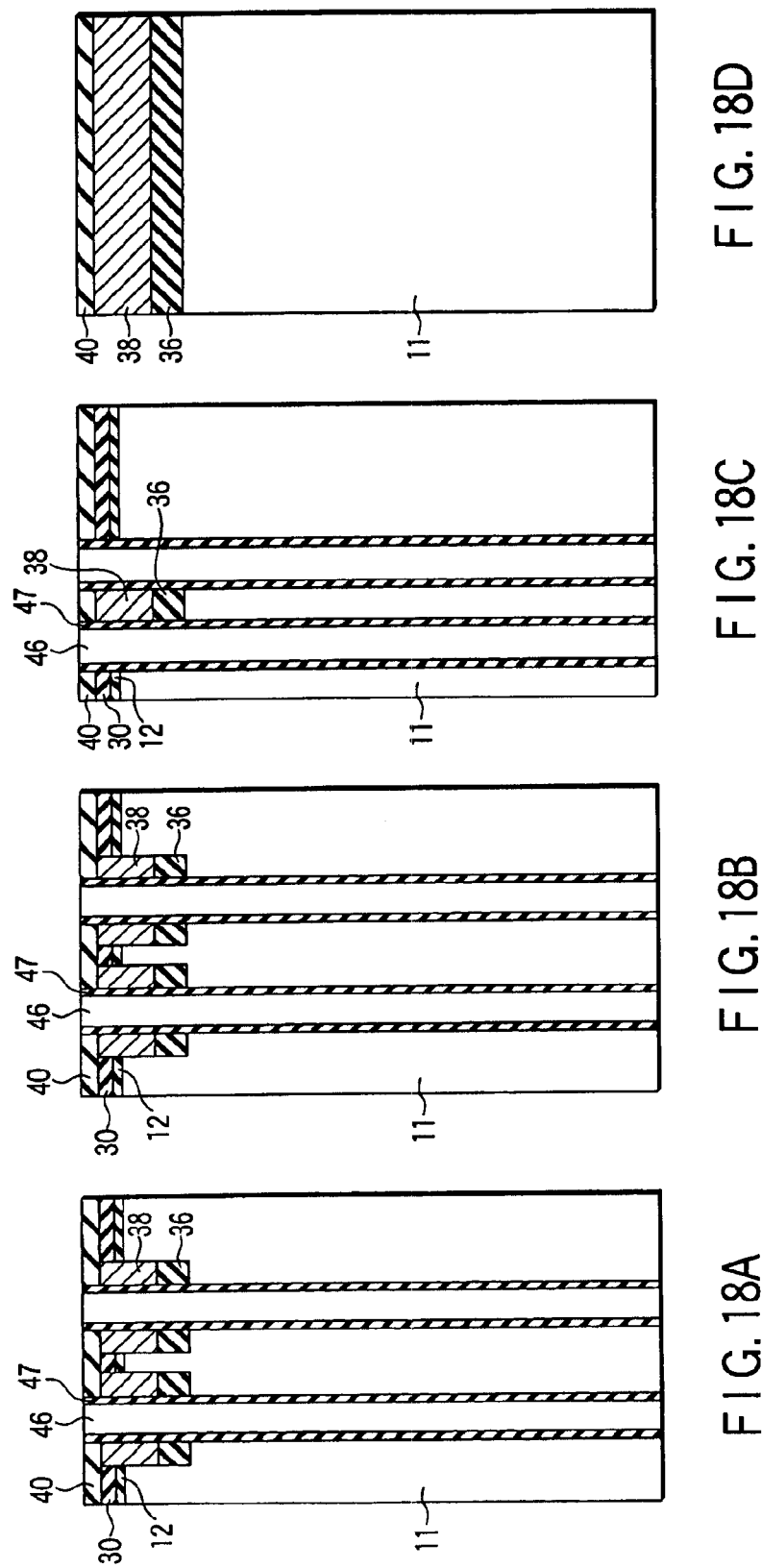

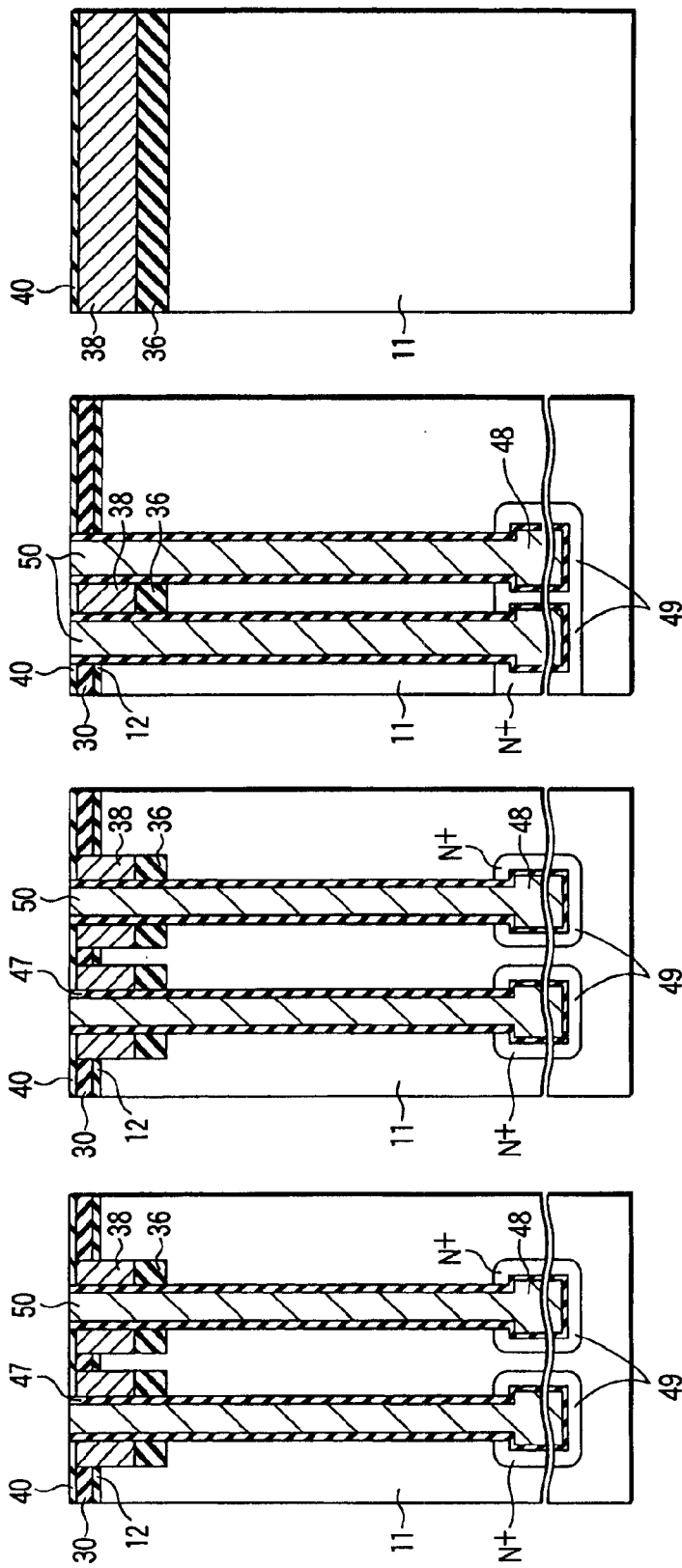

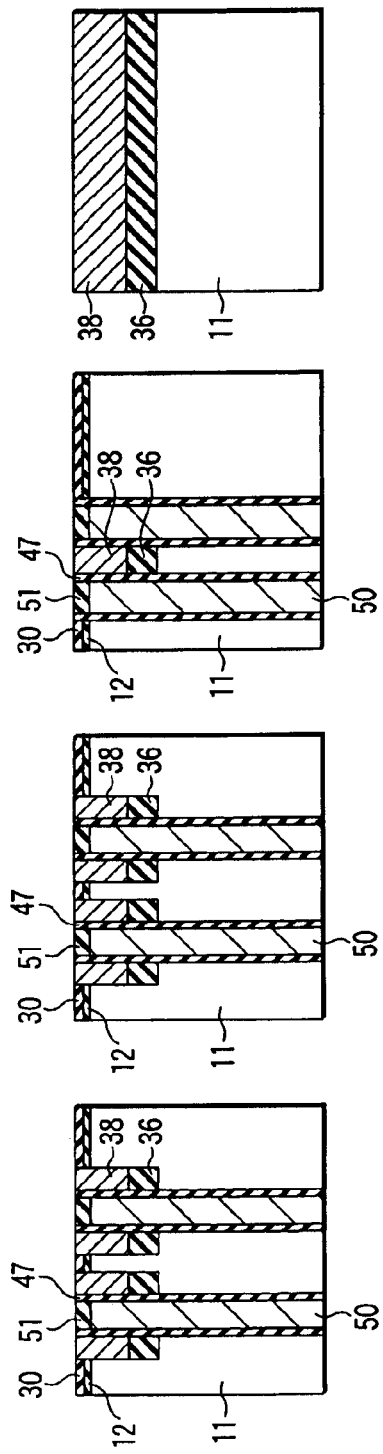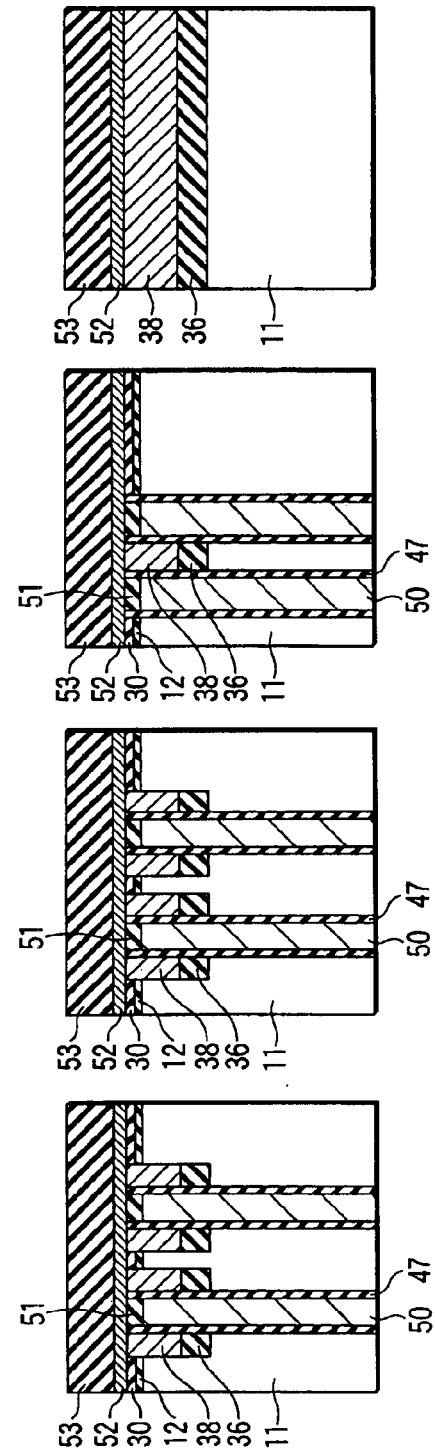

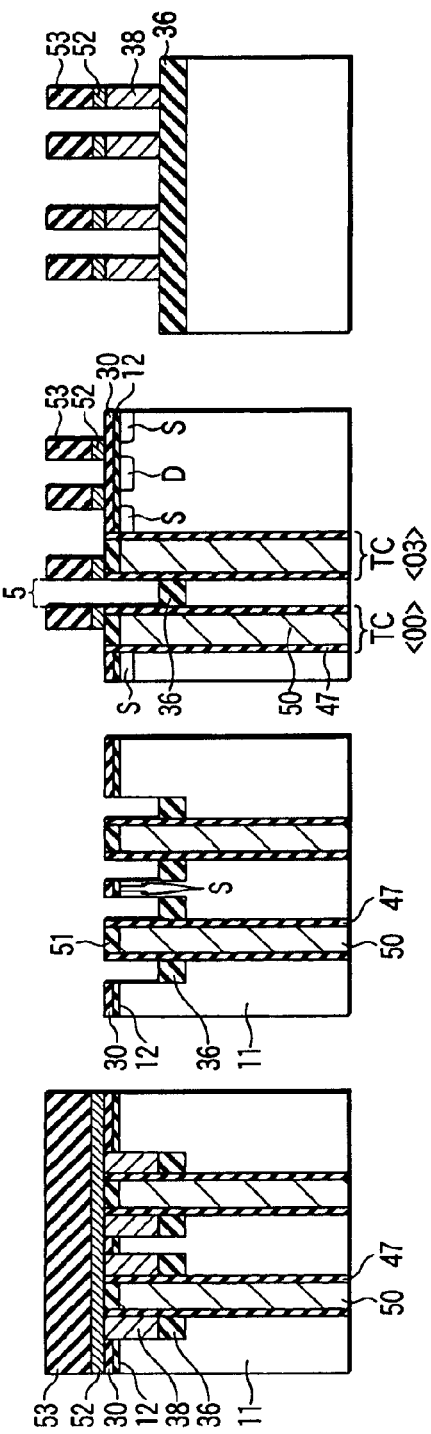

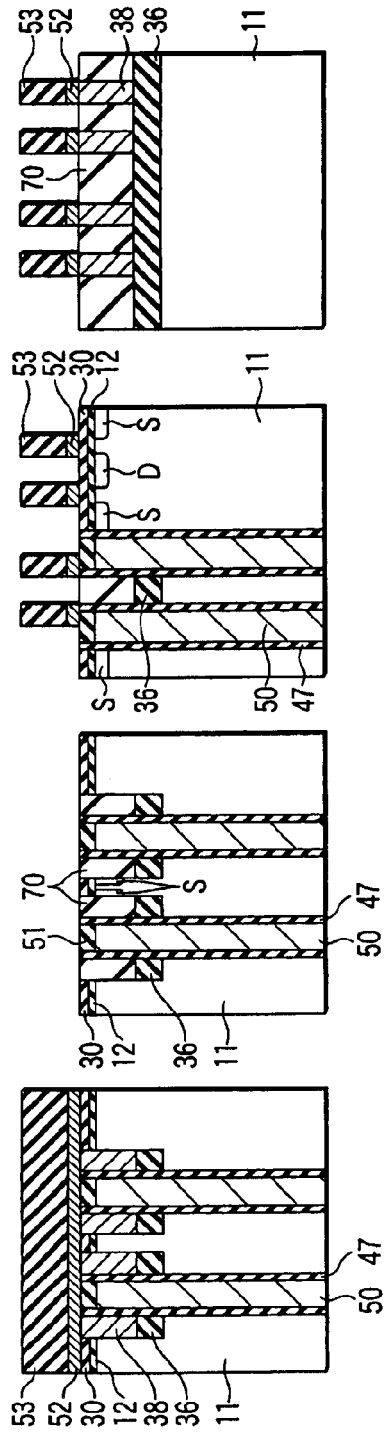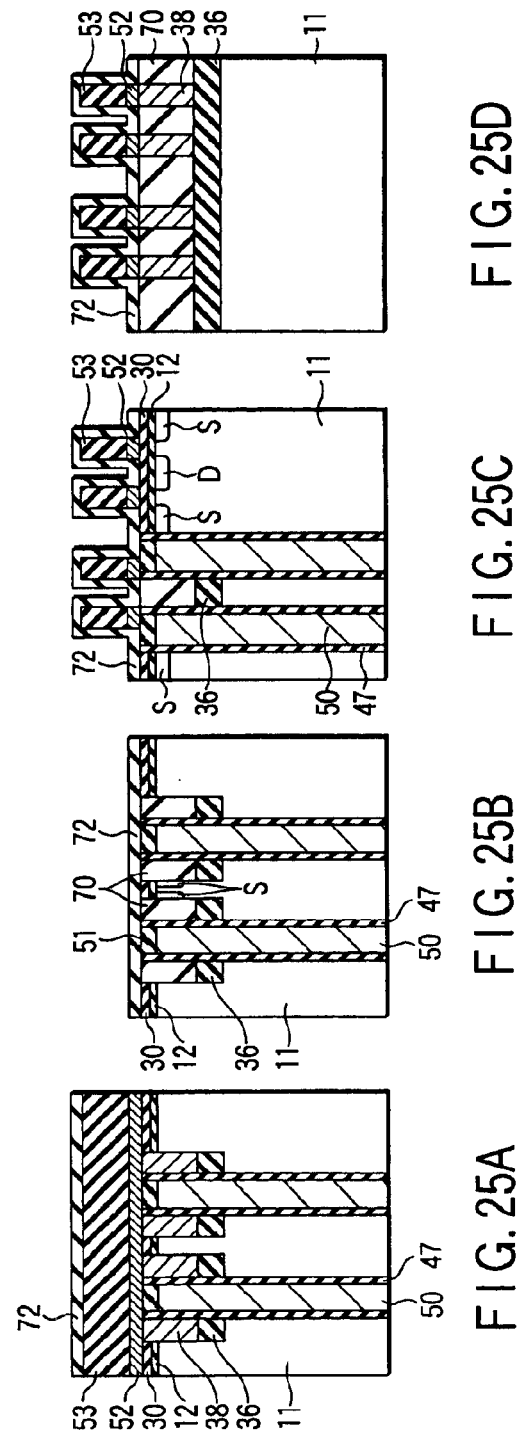

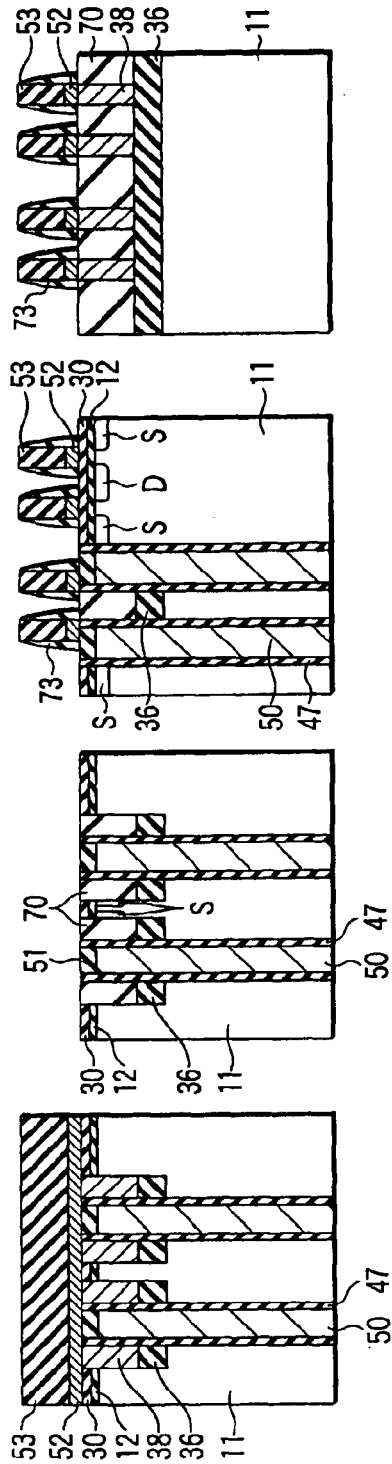

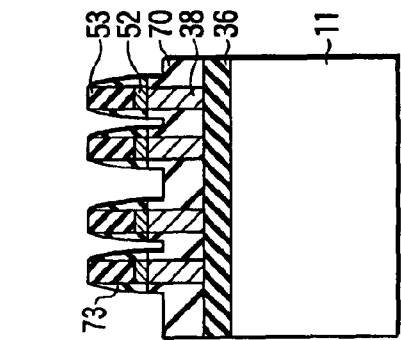
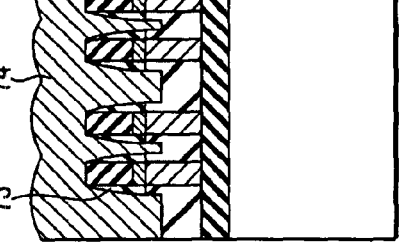
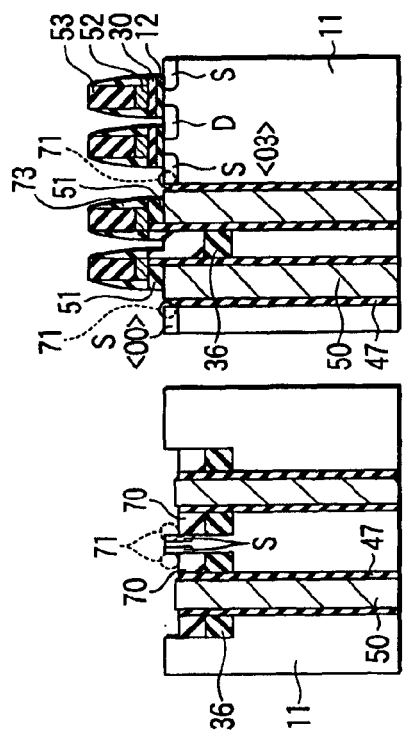
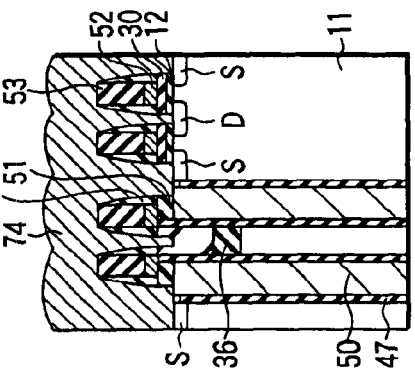
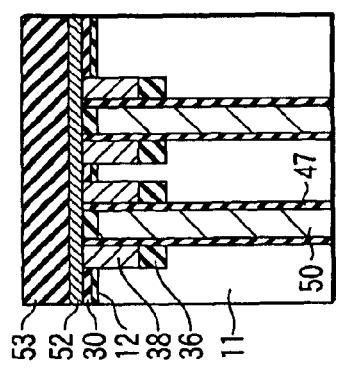
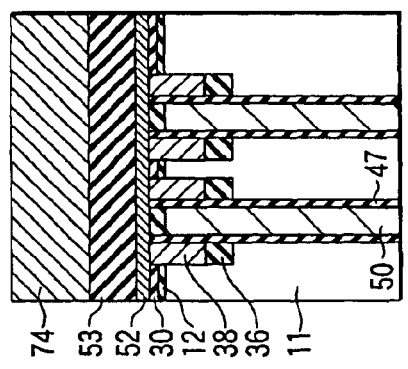

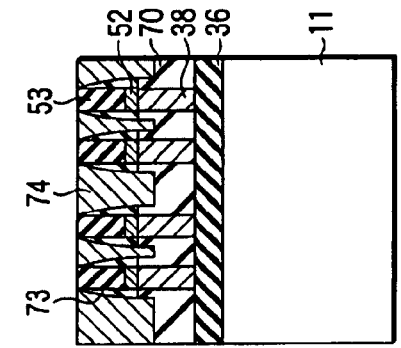
FIG. 30A
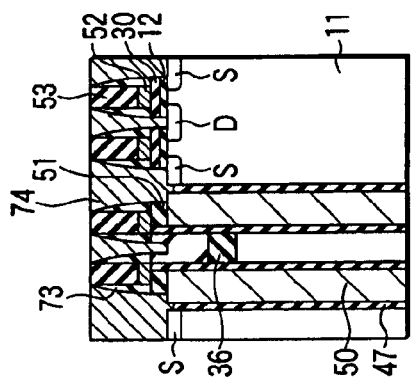
FIG. 30B
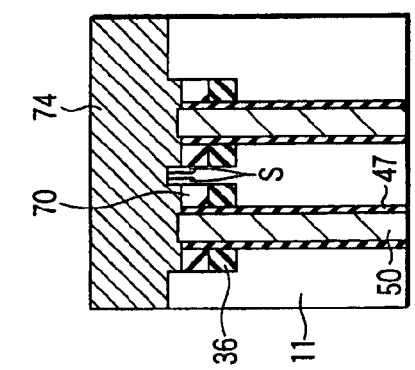
FIG. 30C
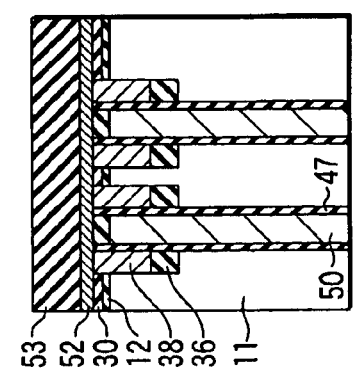
FIG. 30D
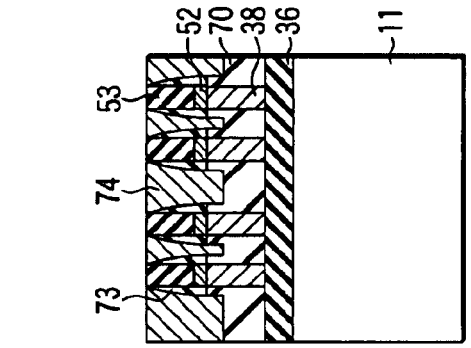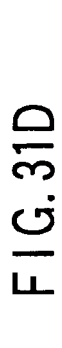
FIG. 31A
FIG. 31B
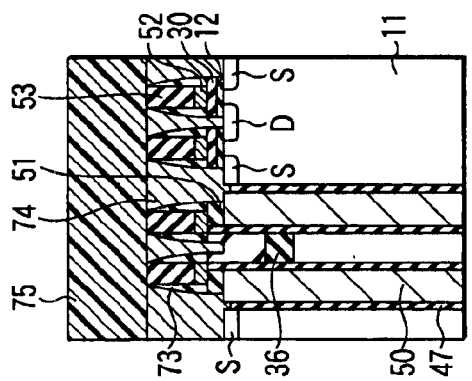
FIG. 31C
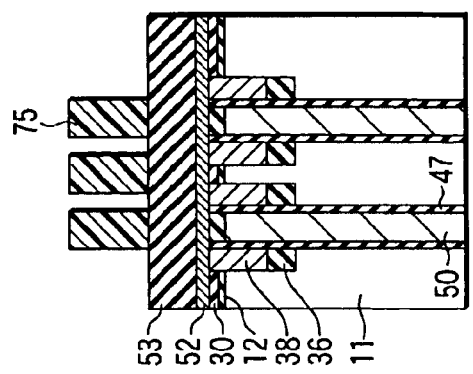
FIG. 31D

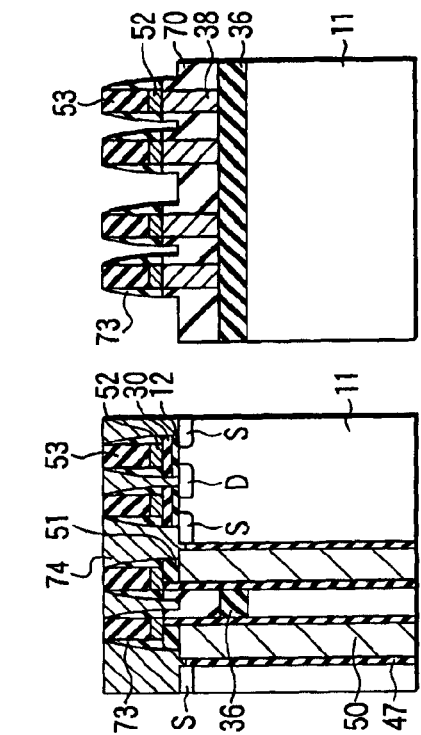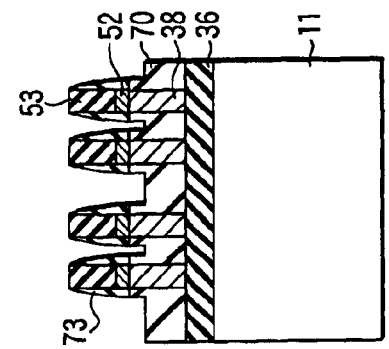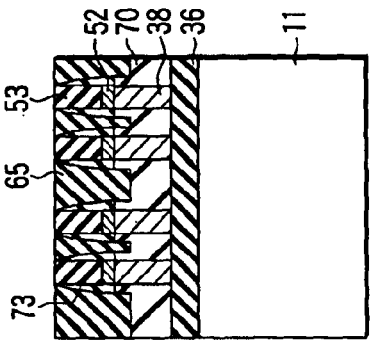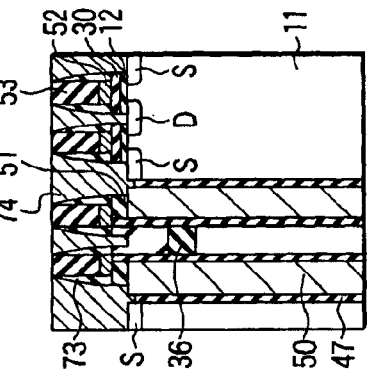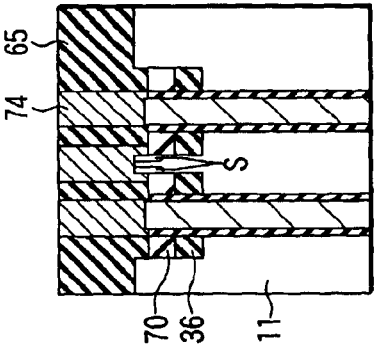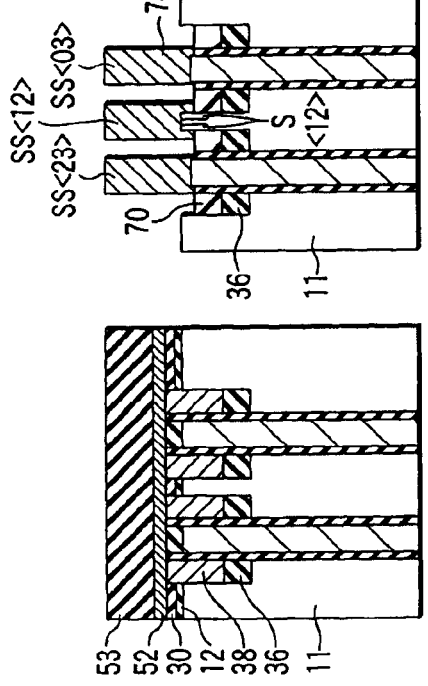

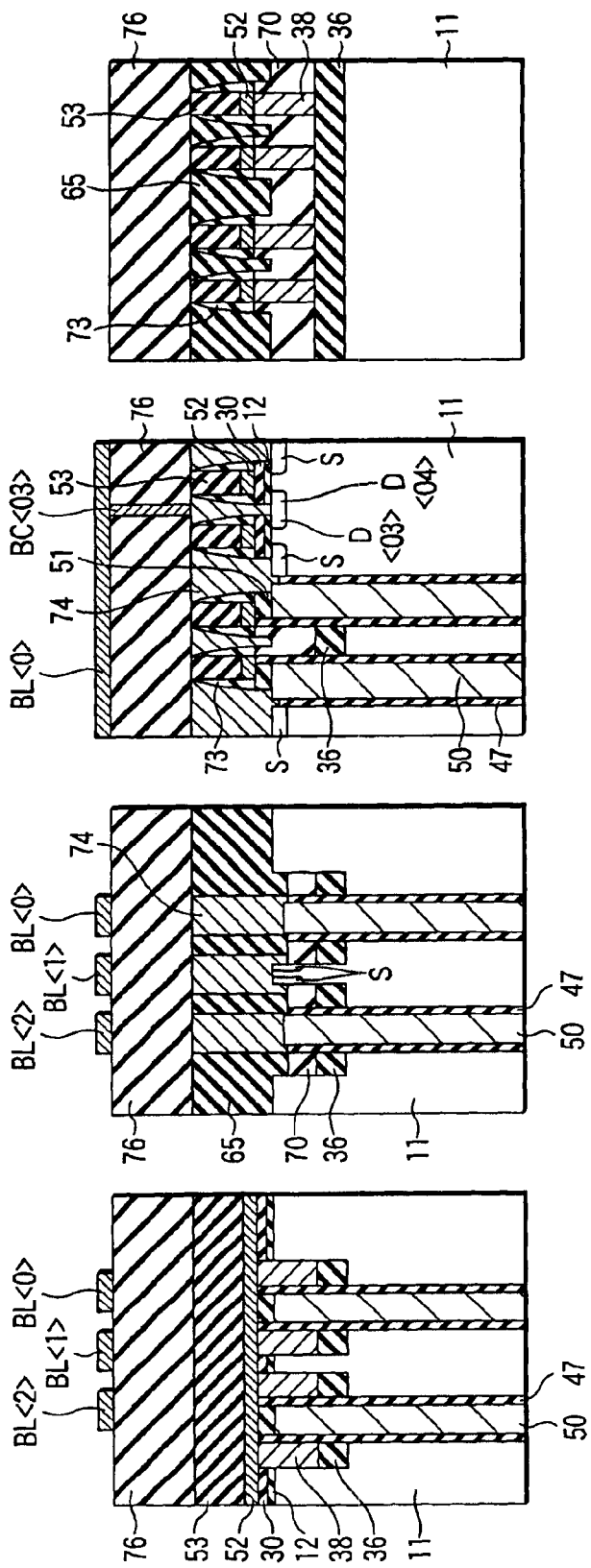

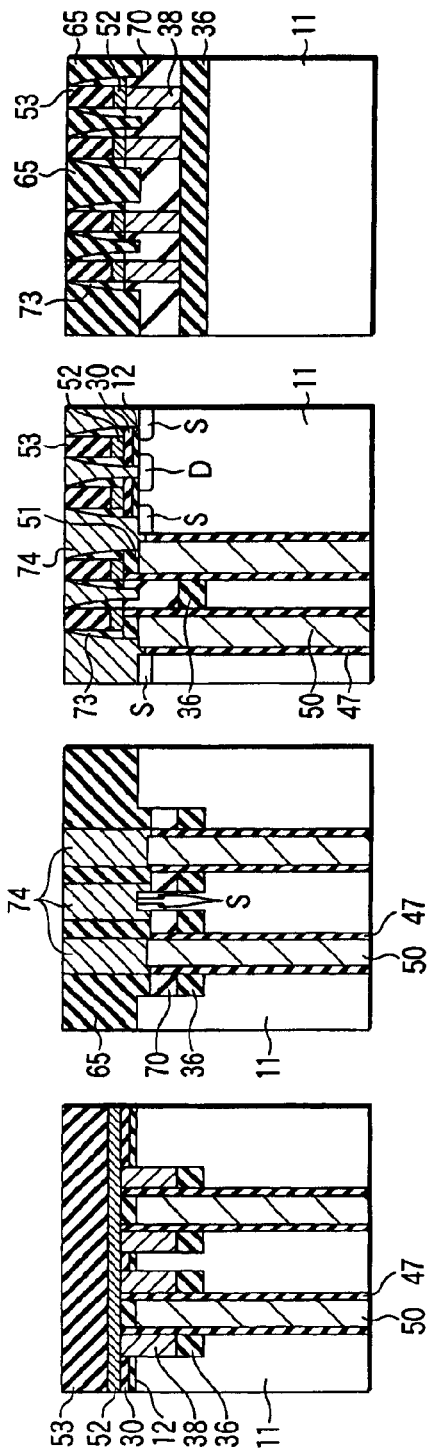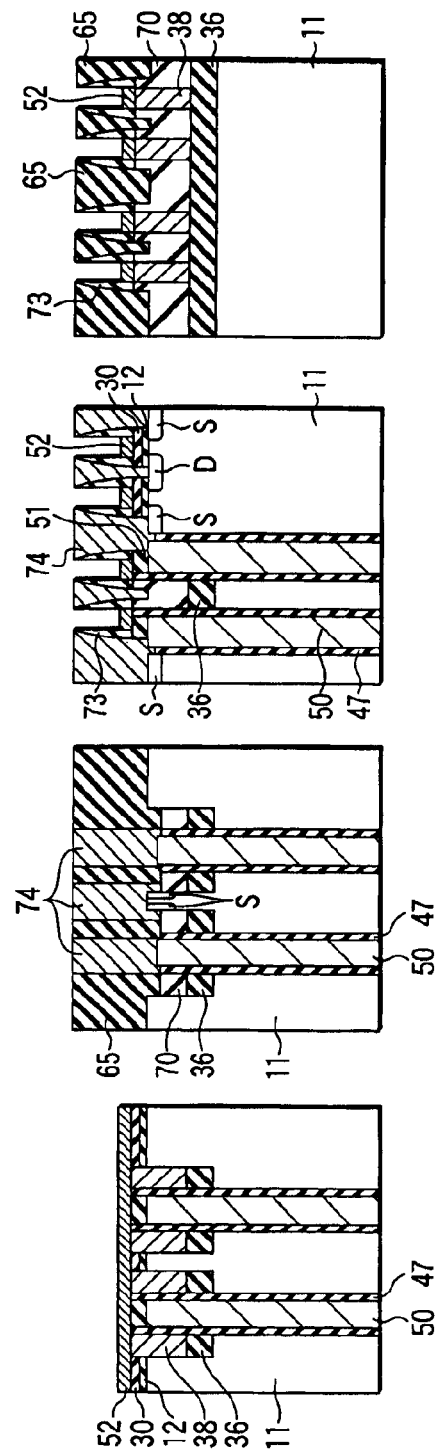

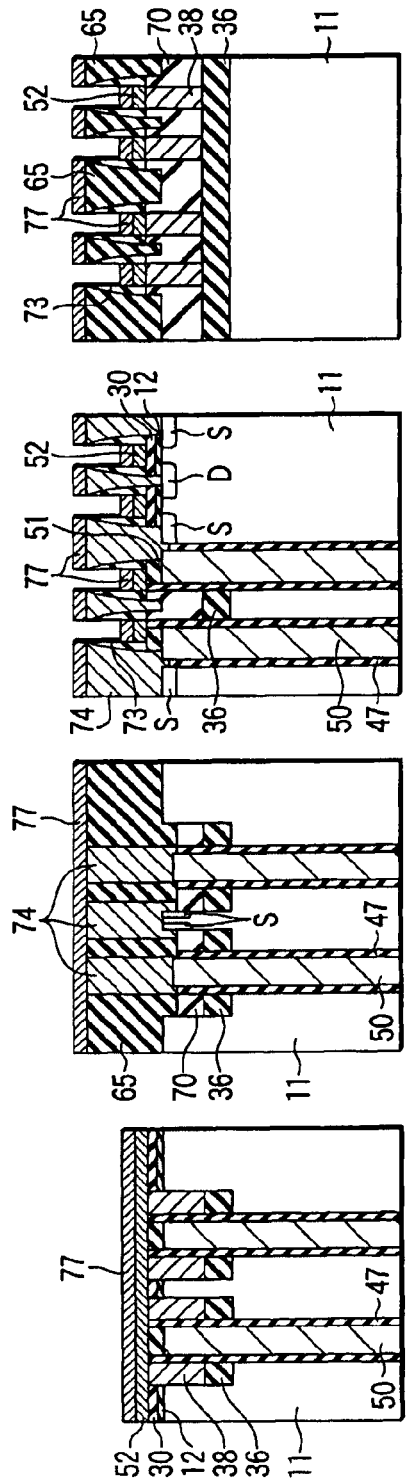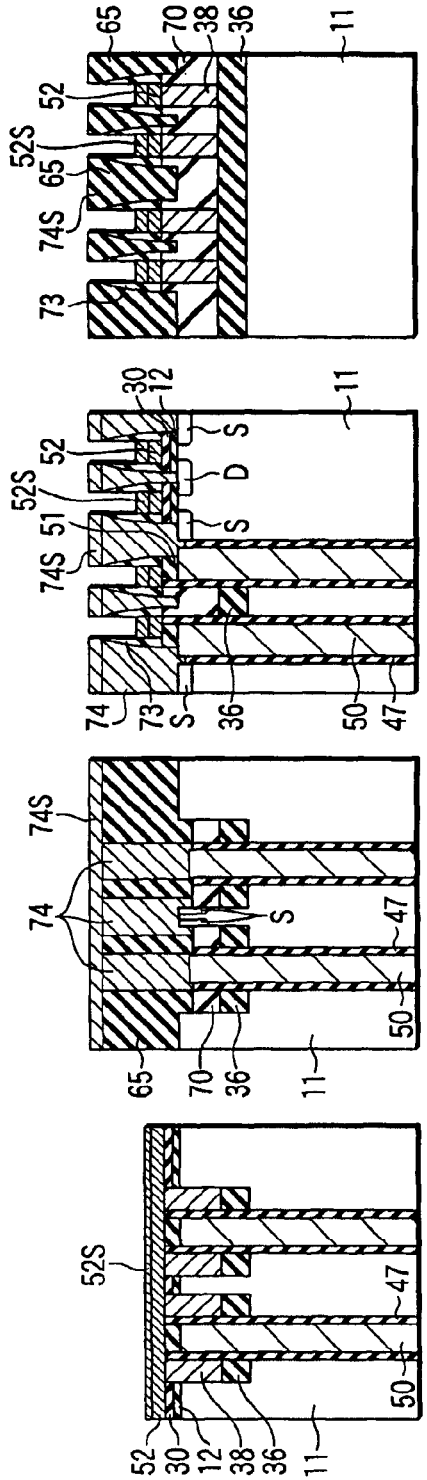

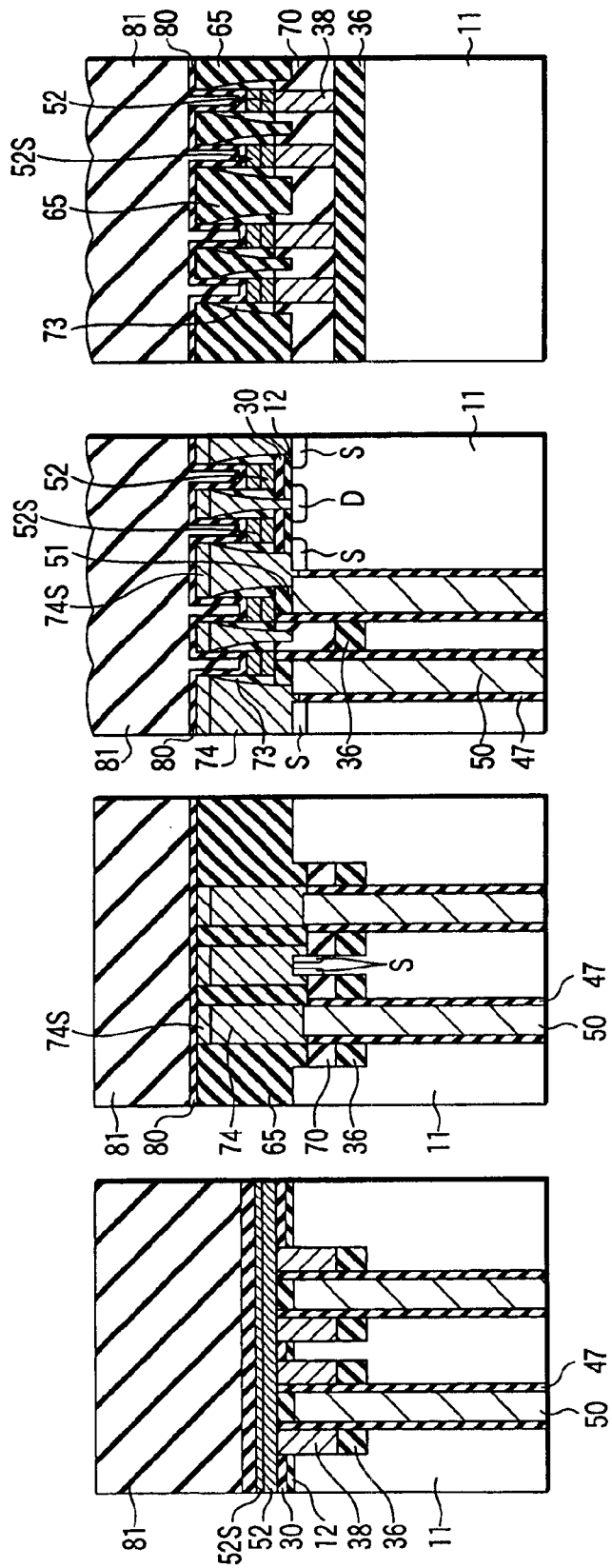

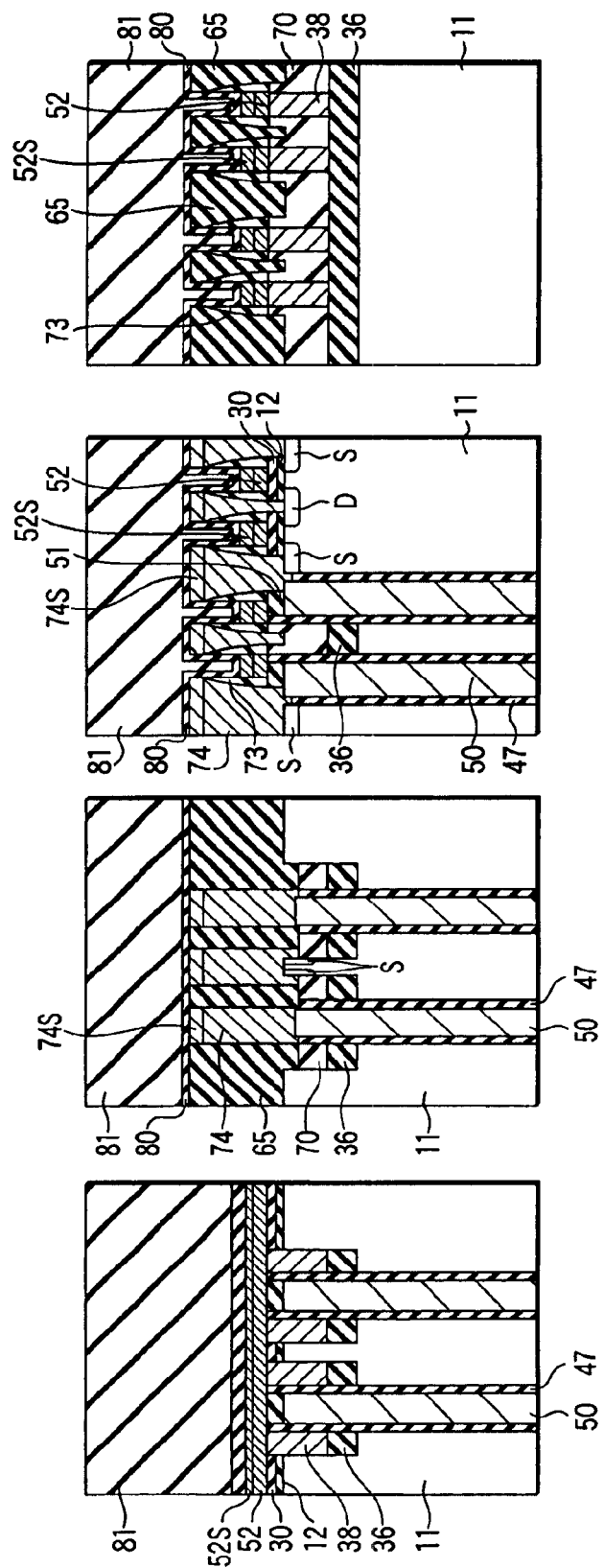

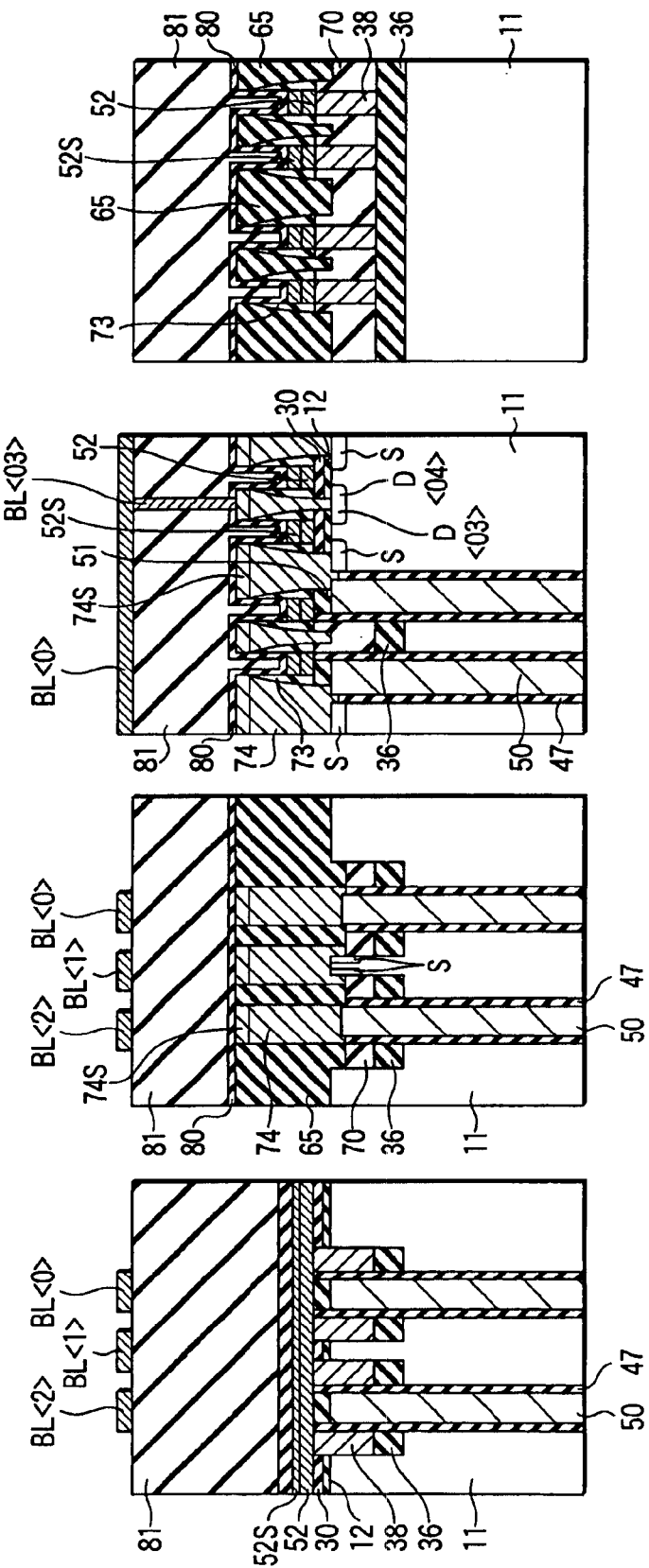

SEMICONDUCTOR MEMORY DEVICE WITH SURFACE STRAP AND METHOD OF FABRICATING THE SAME

CROSS-REFERENCE TO RELATED APPLICATIONS

This application is based upon and claims the benefit of priority from the prior Japanese Patent Application No. 2003-166851, filed Jun. 11, 2003, the entire contents of which are incorporated herein by reference.

BACKGROUND OF THE INVENTION

1. Field of the Invention

The present invention relates generally to a semiconductor memory device having a surface strap, and a method of fabricating the semiconductor memory device, and more particularly to a DRAM (Dynamic Random Access Memory) having a trench capacitor. This invention is applied to a fin-gate trench-type DRAM.

2. Description of the Related Art

In recent years, with a decrease in cell size due to reduction in design rules, a channel width, which is an important parameter for determining a current drive power of a cell transistor, has decreased and a drive power has lowered. In order to suppress such lowering in driving power of the cell transistor, a trench-type DRAM cell using a fin-gate-type double-gate transistor is proposed (e.g. Jpn. Pat. Appln. KOKAI Publication No. 2002-118255).

In a prior-art fabrication process of forming the trench-type DRAM, there is a case where after a gate electrode of a cell transistor is processed, a spacer SiN film is formed on a side wall of the gate electrode to provide a source/drain region with an LDD (Lightly Doped Drain) structure. At this time, in the case of a fin-gate cell transistor, the SiN film is also formed on a side wall of an activation region (source/drain region) at a position deeper than the major surface of the semiconductor substrate. As a result, when the trench capacitor and one of activation regions of the cell transistor are electrically connected by a surface strap, contact is made only at a substrate surface portion.

FIG. 1 is a cross-sectional view schematically showing the structure of a contact area between a trench capacitor and a source region of a cell transistor in a trench-type DRAM using the conventional fin-gate-type double-gate transistor.

FIG. 1 is an enlarged view showing a pillar FIN formed in a major surface portion of a semiconductor substrate 111, an STI oxide film 100 serving as a device isolation region, a source region 101 formed in the pillar FIN, a surface strap 102, an SiN film 103 formed at a side wall portion of the pillar FIN, a barrier SiN film 104, and a BPSG film 105.

In a contact side-wall portion 106 encircled by a broken line, a portion of the SiN film 103, which is formed as the spacer SiN film on the side wall of the gate electrode, is left, and the surface strap 102 is electrically connected to the source region 101 only at an upper surface thereof (i.e. an upper surface of the pillar FIN). Thus, contact resistance between the surface strap 102 and source region 101 increases.

Recently, to meet a demand for miniaturization, the width of the pillar FIN and activation region is reduced. Consequently, with the prior-art structure wherein contact is made only at the surface of the pillar, the contact area between the surface strap and source region decreases and the contact resistance increases. This may lead to a deterioration in data storage characteristics and data write speed of the DRAM.

BRIEF SUMMARY OF THE INVENTION

According to an aspect of the present invention, there is provided a semiconductor memory device including memory cells each having a trench capacitor and a fin-gate-type MOSFET that selects the trench capacitor, comprising: a pillar formed on a major surface of a semiconductor substrate; a device isolation region formed on the semiconductor substrate in a vicinity of a proximal portion of the pillar; a gate electrode functioning as a word line, the gate electrode being formed on a side wall and an upper surface of the pillar; a gate insulation film interposed between the pillar and the gate electrode; a first activation region formed in the pillar and connected to a bit line; a second activation region formed in the pillar and spaced apart from the first activation region such that the gate electrode is interposed between the second activation region and the first activation region; a first oxide film formed on a side wall of the gate electrode, which corresponds to an upper surface of the pillar; a trench formed in a vicinity of the second activation region in the pillar; a capacitor formed on a side wall portion of the trench; a second oxide film formed on the device isolation region at an upper part of the side wall of the pillar such that the second oxide film is located lower than the upper surface of the pillar; and a surface strap formed on the second oxide film at a position above the second activation region in the pillar, the surface strap electrically connecting the second activation region and one of electrodes of the capacitor, wherein insulation of the side wall of the gate electrode is effected by the first oxide film alone, insulation between the gate electrode and the surface strap is effected by the second oxide film alone, and contact between the surface strap and the second activation region is made at the upper surface and the side wall of the pillar.

According to another aspect of the present invention, there is provided a method of fabricating a semiconductor memory device, comprising: recess-etching a major surface of a semiconductor substrate, thereby forming a pillar that becomes a device formation region; burying an insulation film in the recess-etched region, thereby forming a device isolation region; forming at least a part of a gate insulation film on a surface of the pillar; burying a gate electrode material at the device isolation region in the recess-etched region, thereby forming a gate electrode on a side wall and an upper surface of the pillar; forming a trench in a vicinity of an end portion of the pillar, and forming a capacitor on a side wall portion of the trench; introducing impurities in the pillar using the gate electrode as a mask, thereby forming first and second activation regions such that the gate electrode is interposed between the first and second activation regions; burying a first oxide film at a side wall of the pillar on the device isolation region such that the gate electrode is interposed; forming a second oxide film on an upper part of the pillar; removing an upper part of the first oxide film using the second oxide film as a mask, thereby exposing an upper surface and an upper part of the side wall of the pillar; and forming a conductive material on the exposed upper surface and the exposed upper part of the side wall of the pillar, thereby forming a surface strap that electrically connects the capacitor and the second activation region.

BRIEF DESCRIPTION OF THE SEVERAL VIEWS OF THE DRAWING

FIG. 7 is a view for describing the semiconductor memory device according to the first embodiment of the invention, FIG. 7 being a cross-sectional view showing, in enlarged scale, a part of the pillar shown in FIG. 5;

FIGS. 8A through 34A illustrate fabrication steps of the semiconductor memory device according to the first embodiment of the invention, FIGS. 8A through 34A being cross-sectional views taken along line 8—8 in FIG. 3;

FIGS. 8B through 34B illustrate fabrication steps of the semiconductor memory device according to the first embodiment of the invention, FIGS. 8B through 34B being cross-sectional views taken along line 5—5 in FIG. 3;

FIGS. 8C through 34C illustrate fabrication steps of the semiconductor memory device according to the first embodiment of the invention, FIGS. 8C through 34C being cross-sectional views taken along line 6—6 in FIG. 3;

FIGS. 8D through 34D illustrate fabrication steps of the semiconductor memory device according to the first embodiment of the invention, FIGS. 8D through 34D being cross-sectional views taken along line 9—9 in FIG. 3;

FIGS. 37A through 43A illustrate fabrication steps of the semiconductor memory device according to the second embodiment of the invention, FIGS. 37A through 43A being cross-sectional views taken along line 8—8 in FIG. 3;

FIGS. 37B through 43B illustrate fabrication steps of the semiconductor memory device according to the second embodiment of the invention, FIGS. 37B through 43B being cross-sectional views taken along line 5—5 in FIG. 3;

FIGS. 37C through 43C illustrate fabrication steps of the semiconductor memory device according to the second embodiment of the invention, FIGS. 37C through 43C being cross-sectional views taken along line 6—6 in FIG. 3; and FIGS. 37D through 43D illustrate fabrication steps of the semiconductor memory device according to the second embodiment of the invention, FIGS. 37D through 43D being cross-sectional views taken along line 9—9 in FIG. 3.

DETAILED DESCRIPTION OF THE INVENTION

Figure 2:
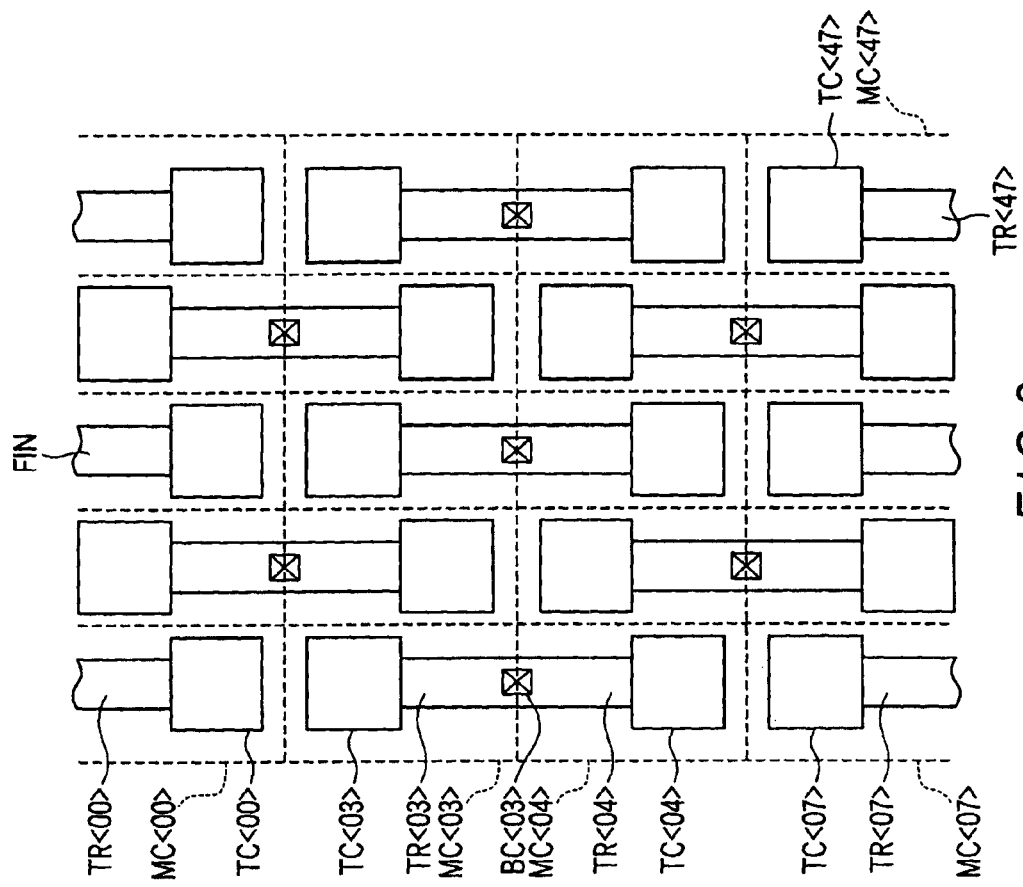
FIG. 2 is a view for describing a semiconductor memory device according to a first embodiment of the present invention, FIG. 2 being a plan view schematically illustrating a memory cell array using a fin-gate-type MOSFET and a trench capacitor.

Embodiments of the present invention will now be described with reference to the accompanying drawings. In the description below, common parts are denoted by like reference numerals throughout all the drawings.

[First Embodiment]

Figure 3:
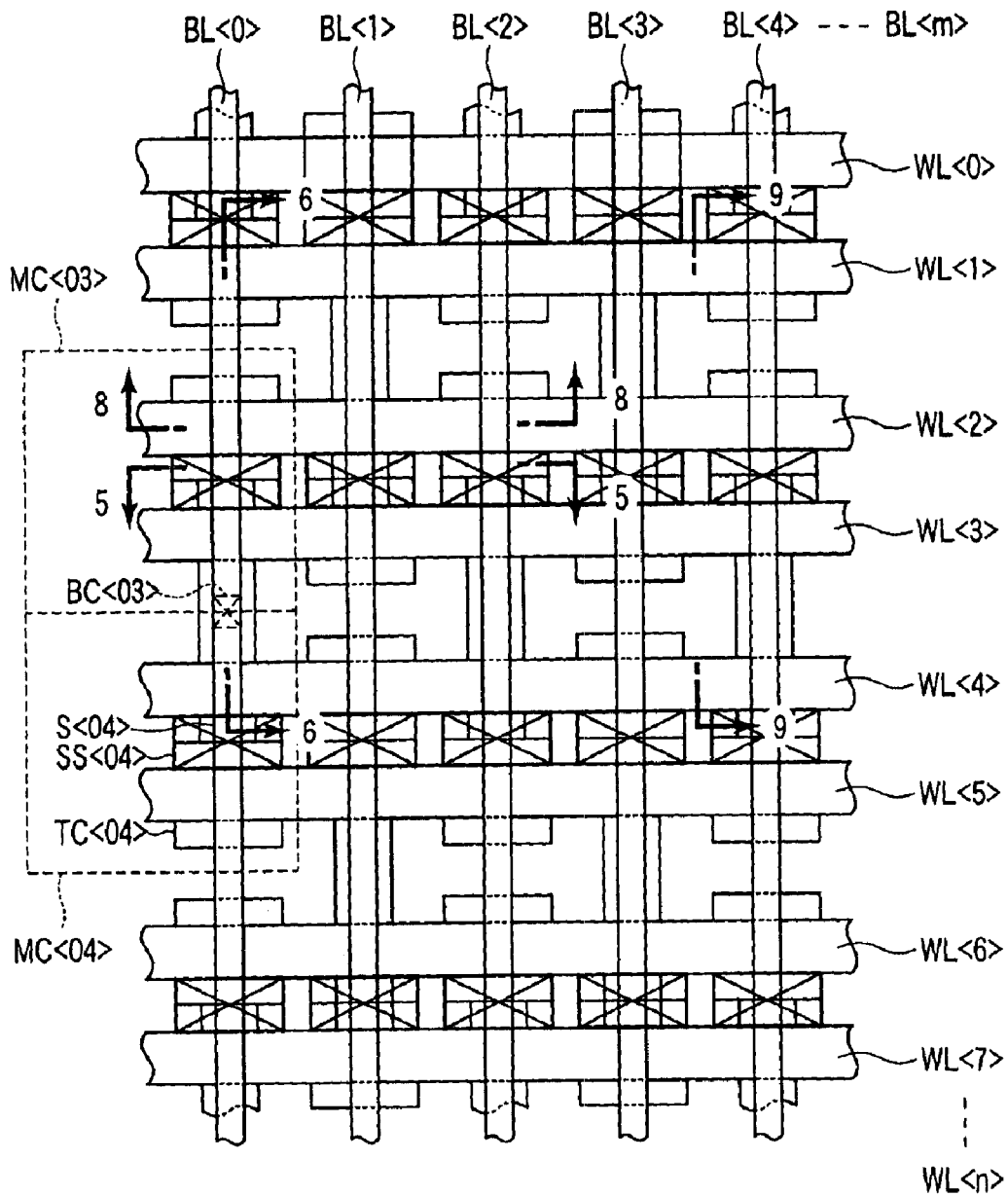
FIG. 3 is a view for describing the semiconductor memory device according to the first embodiment of the invention, FIG. 3 being a plan view schematically illustrating a memory cell array wherein word lines, bit lines and surface straps are added to the plan view of FIG. 2.

A semiconductor memory device according to a first embodiment of the present invention will now be described with reference to FIG. 2 to FIG. 7. FIGS. 2 and 3 are views for describing the semiconductor memory device according to the first embodiment. FIGS. 2 and 3 show a trench-type DRAM by way of example. FIG. 2 is a plan view schematically showing a memory cell array using memory cells each comprising a fin-gate-type MOSFET (Metal Oxide Semiconductor Field Effect Transistor) and a trench capacitor. FIG. 3 is a plan view schematically illustrating the memory cell array wherein word lines, bit lines and surface straps are added to the plan view of FIG. 2.

To begin with, an example of a pattern layout of the memory cell array is described referring to plan views of FIGS. 2 and 3. In FIGS. 2 and 3, <nm> (m, n a positive integer) corresponds to <column & row> of each memory cell. In FIG. 2, MC<00> to MC<47>, which are encircled by broken lines, are 1-bit memory cells. As is shown in FIG. 3, the memory cells MC<00> to MC <47> are provided at intersections of bit lines BL (BL <0> to BL<4>) and word lines WL (WL<0> to WL<7>). The bit lines extend along the longitudinal axis of a pillar FIN which becomes a device region. The word lines WL extend over the pillar FIN so as to cross the bit lines BL.

Each memory cell MC comprises a fin-gate-type MOSFET (TR) (TR<00> to TR<47>) and a trench capacitor TC (TC<00> to TC<47>). A source region, which is one of activation regions of each transistor TR, is connected to one of electrodes of the associated trench capacitor TC. A drain region, which is the other activation region of each transistor TR, is shared by a drain region of a transistor TR in the adjacent memory cell MC. Thereby, a pair of memory cells MC are formed. The drain region of each transistor TR is connected to the associated bit line via a bit line contact (connection portion) BC (BC<03>, . . . ). The paired memory cells MC are arranged such that the transistors TR and trench capacitors TC are alternately disposed in the direction of word lines WL. The area occupied by the pattern can be reduced by alternately arranging the paired fin-gate-type MOSFETs TR and paired trench capacitors in a staggered fashion.

Figure 4:
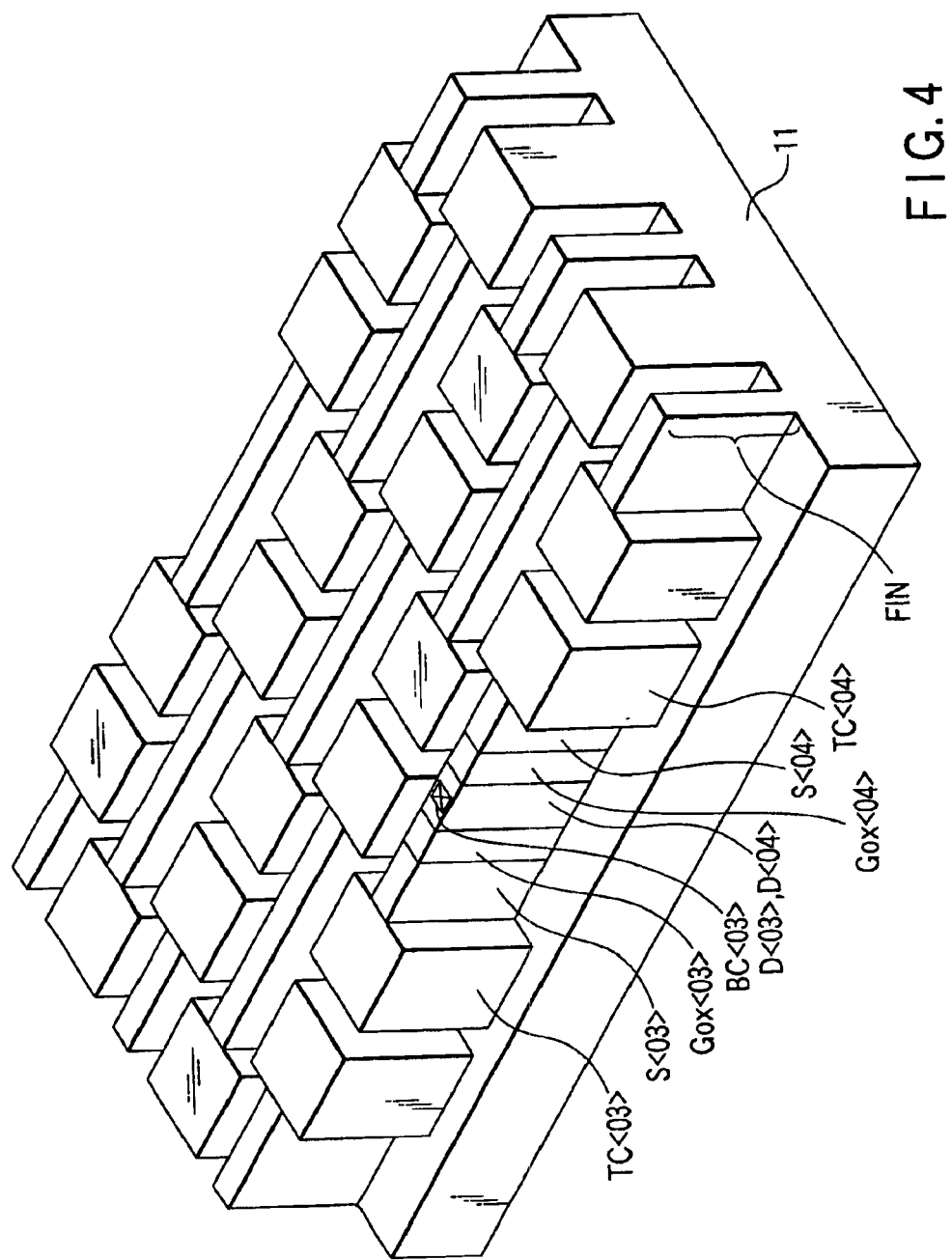
FIG. 4 is a view for describing the semiconductor memory device according to the first embodiment of the invention, FIG. 4 being a perspective view schematically showing a main part of the memory cell array.

The plan-view structure of surface straps is described in detail, paying attention to the memory cell MC<03> and memory cell MC<04> in FIG. 3. In addition, the three-dimensional structure of the surface straps is described referring to a perspective view of FIG. 4. FIG. 4 is a perspective view schematically showing a main part of the memory cell array shown in FIG. 3.

As is shown in FIG. 3, surface straps SS (SS<00> to SS<47>) are formed on the source regions of MOSFETs TR and trench capacitors TC along the word lines WL. The surface straps SS are formed between adjacent word lines WL. The surface straps SS effects electrical connection between the source region S of each MOSFET TR and one of the electrodes of each trench capacitor TC.

As is shown in FIG. 4, a major surface of a P-type silicon semiconductor substrate 11 is processed to have projecting pillars (projecting semiconductor regions) FIN. The height of the pillar FIN is, for instance, about 0.3 to 1.0 μm, but it may be less than 0.3 μm. Channel regions are formed on both side walls of the pillar FIN. A gate insulation film Gox (Gox <03>, Gox <04>) is formed on the surface of the channel region. The thickness of the gate insulation film Gox is, e.g. about 5 nm. A gate electrode is formed on the gate insulation film Gox, and the gate electrode is connected to a word line WL (not shown).

Source regions S (S<03>, S<04>)/drain regions D (D<03>, D<04>), which are activation regions, are formed on both side walls in the inside of the pillar FIN so as to sandwich the channel regions. The source region S/drain region D, for instance, is formed by diffusing N+ impurities. The drain region D is connected to a bit line BL (BL<0>, not shown) via a bit line contact BC (BC<03>).

The cross-sectional structures of the semiconductor memory device are described in greater detail with reference to FIG. 5, FIG. 6 and FIG. 7.

Figure 5:
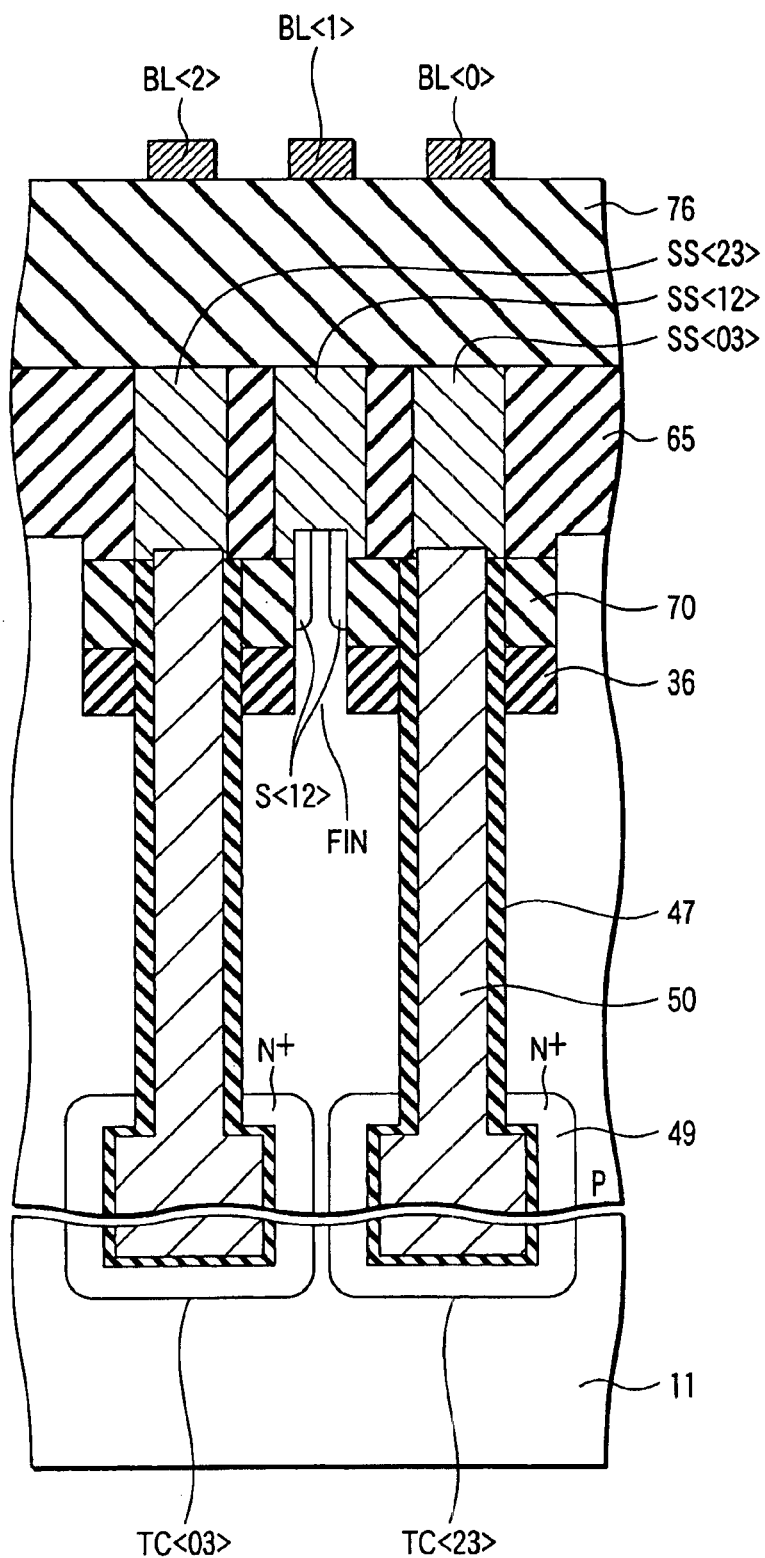
FIG. 5 is a view for describing the semiconductor memory device according to the first embodiment of the invention, FIG. 5 being a cross-sectional view taken along a line parallel to word lines of DRAM cells.

FIG. 5 is a cross-sectional view taken along line 5—5 in FIG. 3. FIG. 6 is a cross-sectional view taken along line 6—6 in FIG. 3. FIG. 7 is a cross-sectional view showing, in enlarged scale, a part of the pillar shown in FIG. 5.

As is shown in FIG. 5, a silicon oxide film 36 serving as a device isolation region is buried in a major surface portion of the P type silicon substrate 11. An SOG (Spin On Glass) film 70 is formed on a side wall of the pillar FIN over the silicon oxide film 36 so as to sandwich the gate electrode. The upper surface of the SOG film 70 is formed to be lower than the upper surface of the pillar FIN, and a surface strap SS (SS<12>) is formed on the SOG film 70. Further, the SOG film 70 is formed on the side surface of the pillar between the gate electrode and the surface strap (not shown).

A trench capacitor TC (TC<03>, TC<23>) is formed in the silicon substrate 11 so as to be sandwiched between the silicon oxide films 36 and SOG films 70 via a collar insulation film 47. Further, surface straps SS (SS<03>, SS<12> and SS<23>) are formed on the pillar FIN and trench capacitor TC. An SOG film 65, for instance, is formed as an interlayer insulation film between the surface straps SS.

Figure 6:
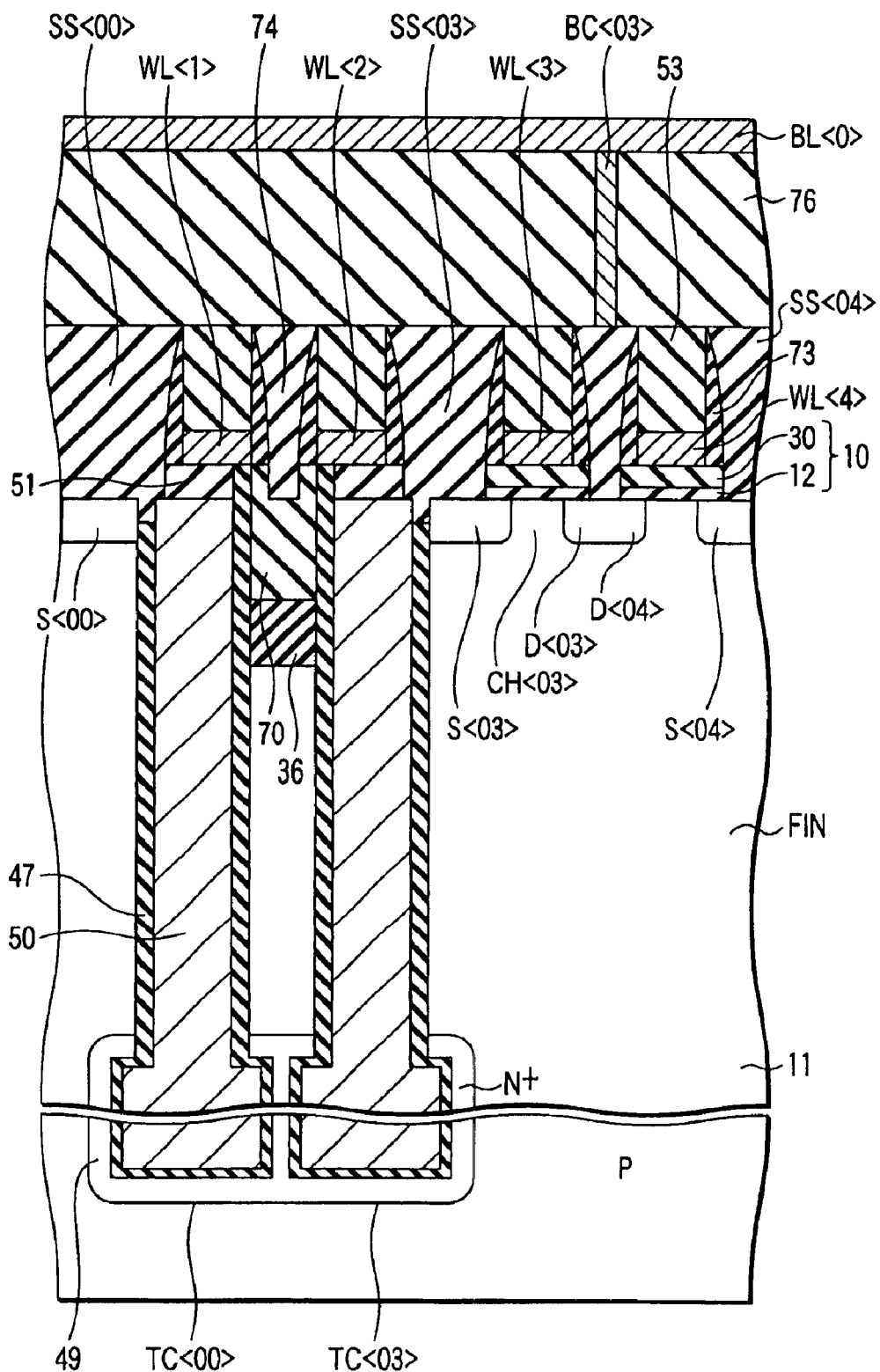
FIG. 6 is a view for describing the semiconductor memory device according to the first embodiment of the invention, FIG. 6 being a cross-sectional view taken along a line parallel to bit lines of DRAM cells.
Figure 16D:
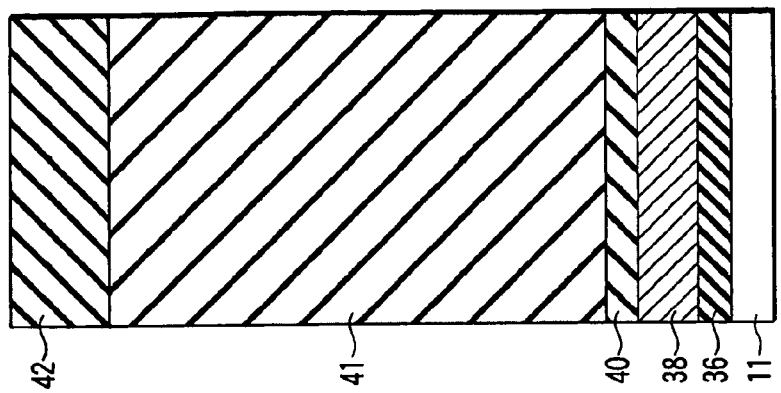
Figure 16C:
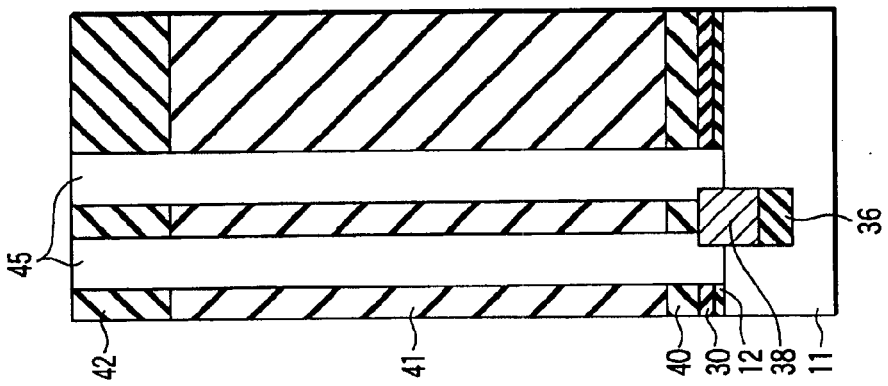
Figure 16B:
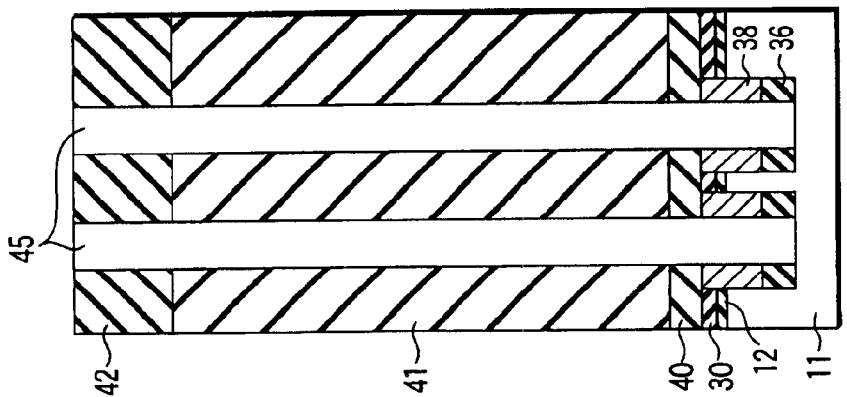
Figure 16A:
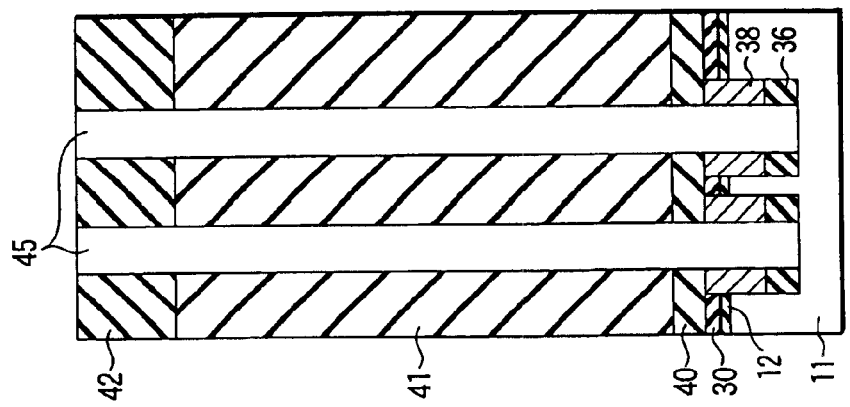

In addition, as shown in FIG. 6, a word line WL (WL<1>, WL<2>, WL<3>, WL<4>) is formed on the upper surface of the pillar FIN via an insulation film 10 having a thickness of, e.g. 0.1 μm or less. Thus, word lines (active word lines) WL<3> and WL<4> are formed via insulation films 10 formed on the channel regions. The active word line WL, in this context, refers to a word line for switching on/off the transistor provided immediately below the word line WL. The insulation film 10 comprises a silicon oxide film 12, which is, e.g. 0.002 μm thick, and a silicon nitride film 30, which is, e.g. 0.07 μm thick.

A buried insulation film 51 is formed on the upper surface of the trench capacitor TC. The collar insulation film 47 is formed along the inner wall of the trench capacitor TC. The thickness of the buried insulation film 51 is, e.g. 0.03 μm or more, and is greater than the thickness of the gate insulation film Gox. Word lines (passing word lines) WL of adjacent memory cells are formed on the respective buried insulation films 51. For example, passing word lines WL<1> and WL<2> are formed on the buried insulation films 51 formed on the upper surfaces of trench capacitors TC<00> and TC<03>. The passing word line WL merely passes over the capacitor TC and has no relation to the switching operation of the memory cell MC. As described above, the word lines WL comprise the active word lines and passing word lines, which are alternately arranged.

A BPSG (Boron Phosphide Silicate Glass) film 53, which is an example of capping material, is formed on the word line WL. A spacer 73 formed of an oxide film is formed on a side wall of the word line WL. A TEOS (Tetra Ethyl Ortho Silicate) film 76 is formed on the BPSG film 53. A bit line contact BC (BC<03>) is formed in the TEOS film 76 formed on amorphous silicon 74, which is formed on the drain region D. The bit line contact BC establishes electrical connection between the bit line BL formed on the TEOS film 76 and the drain region of the MOSFET.

As described above, the source region S (S<00>, S <03>) is connected to the trench capacitor TC (TC<00>, TC<03>) via the surface strap SS (SS<00>, SS<03>).

As is shown in FIG. 7, the surface strap SS (SS<12>) is formed so as to contact not only the upper surface but also the side surface of the pillar FIN in which the source region S (S<12>) is formed. Thus, a side wall 71 of the pillar FIN, in which the source region S is formed, is in contact with the surface strap SS.

The source region S of the MOSFET formed in the pillar FIN is thus electrically connected to one of electrodes (storage electrode 50) of the trench capacitor TC via the surface strap SS that is in contact with the upper surface and side surface of the source region S.

An example of the basic operation of each memory cell MC is described referring to the memory cell MC <03> for instance. In the description below of the example of the basic operation, attention has been paid to the variation in voltage of the bit line BL<0> in the read/write operation.

To begin with, the data read operation is described. The bit line BL<0> is selected and precharged, thereby activating the bit line BL<0>. The precharge level of the bit line BL<0> is, for example, ½ (VDD/2) of a power supply voltage VDD for driving a sense amplifier, which senses a signal from the bit line BL<0>.

Next, the word line WL for reading out data is selected. A positive potential is applied from a word line driver in a row decoder to the selected word line WL. If the word line WL<3>, for instance, is selected, transistors with gate electrodes connected to the word line WL<3> are all turned on. For example, the gate electrode G<03> connected to the word line WL<3> is selected, and the transistor TR<03> is turned on.

Thereby, the bit line BL<0> at the precharge level is electrically connected to the storage electrode, which is one of the electrodes of the trench capacitor TC<03> of memory cell MC<03>.

At this time, if charge is stored in the trench capacitor TC<03> of memory cell MC<03>, the charge is released to the bit line BL<0> from the trench capacitor TC<03> of memory cell MC<03>. As a result, the potential of the bit line BL<0> becomes higher than that of the other bit lines which are at the precharge level (VDD/2). On the other hand, if no charge is stored in the trench capacitor TC<03>, charge is supplied and released from the bit line BL <0> to the trench capacitor TC<03>. Thereby, the potential of the bit line BL<o> becomes lower than that of the other bit lines which are at the precharge level (VDD/2). The sense amplifier connected to the bit line BL<0> senses and amplifies the potential difference. Thereby, logic "1" data or logic "0" data is read out. At this time, in accordance with the read-out "1" or "0" data, logic "1" data or logic "0" data is rewritten in the trench capacitor TC<03> in the memory cell MC<03> ("data refresh").

The data write operation is described below. A voltage VDD or 0 V, corresponding to write data "1" or "0", is applied from the sense amplifier to the bit line BL<0>. If the word line WL<3> is selected, the transistor TR<03> is turned on to electrically connect the bit line BL<0> and the storage electrode of the trench capacitor TC<03>.

Consequently, charge is stored in the trench capacitor TC<03> from the bit line BL<03> via the transistor TR<03>, or charge is released from the trench capacitor TC<03>. The same applies to the operations of the other memory cells MC.

As has been described above, the surface strap SS is formed so as to contact not only the upper surface but also the side surface of the pillar FIN in which the source region S is formed. Thus, the side wall 71 of the pillar FIN, in which the source region S is formed, is in contact with the surface strap SS. The source region S is electrically connected to one electrode (storage electrode 50) of the trench capacitor TC via the surface strap SS, which is in contact with the upper surface and side surface of the source region S formed in the pillar FIN. In short, the contact portion is formed on the side surface, as well as the upper surface, of the pillar FIN, and a larger contact area is realized.

As a result, a contact resistance between the surface strap SS and source region S can be reduced. Furthermore, with reduced contact resistance, the data storage characteristics and data write/read speed can be enhanced.

Besides, the upper surface of the SOG film 70 is formed at a lower level than the upper surface of the pillar FIN, and the surface strap SS is formed on the SOG film 70. Hence, the SOG film 70 is formed on the side surface of the pillar between the gate electrode G and surface strap SS. As a result, electrical insulation between the gate electrode G and surface strap SS can be effected by the oxide film (SOG film 70).

Moreover, the spacer 73 formed of oxide film is provided on the side wall of the word line WL. Therefore, insulation of the side wall of the word line connected to the gate electrode can be effected by the spacer 73 formed of oxide film.

A fabrication method of the semiconductor memory device according to the first embodiment of the present invention will now be described, referring to, by way of example, a fabrication method of the memory cell having the FIN-gate-type MOSFET and trench capacitor shown in FIGS. 2 to 7. In the description below, FIG. 8A to FIG. 34A, FIG. 8B to FIG. 34B, FIG. 8C to FIG. 34C and FIG. 8D to FIG. 34D will be referred to.

FIGS. 8A through 34A are cross-sectional views taken along line 8—8 in FIG. 3, illustrating fabrication steps in succession. FIGS. 8B through 34B are cross-sectional views taken along line 5—5 in FIG. 3, illustrating fabrication steps in succession. FIGS. 8C through 34C are cross-sectional views taken along line 6—6 in FIG. 3, illustrating fabrication steps in succession. FIGS. 8D through 34D are cross-sectional views taken along line 9—9 in FIG. 3, illustrating fabrication steps in succession.

As is shown in FIG. 8A through FIG. 8D, a silicon oxide film 12 with a thickness of, e.g. about 2 nm is deposited by, e.g. thermal oxidation on a major surface of a P type silicon substrate 11. A silicon nitride film 30 with a thickness of, e.g. about 70 nm is deposited on the silicon oxide film 12. A TEOS-SiO$_2$ film 31 with a thickness of, e.g. about 550 nm is deposited on the silicon nitride film 30 by CVD (Chemical Vapor Deposition) using TEOS (Tetra Ethyl ortho Silicate) as a reaction gas. Further, an insulative hard mask film 32 with a thickness of, e.g. about 300 nm and an SOG film 33 with a thickness of, e.g. about 10 nm are formed on the TEOS-SiO$_2$ film 31. The hard mask film 32 and SOG film 33 are used to exactly form a trench (to be described later) in the TEOS-SiO$_2$ film 31. Then, a photoresist 34 is coated on the SOG film 33. The photoresist 34 is exposed and developed to have a pattern for forming device isolation regions (STI (Shallow Trench Isolation) regions). The width of each device isolation region is, e.g. about 90 nm to 110 nm, and the device isolation regions are arranged at intervals of 90 nm to 110 nm. The silicon oxide film 12 may be a thin oxide film with a different composition formed by chemical treatment.

Next, as shown in FIGS. 9A to 9D, using the photoresist 34 as a mask, the SOG film 33, hard mask film 32 and TEOS-SiO$_2$ film 31 are etched by, e.g. RIE (Reactive Ion Etching). Then, the SOG film 33 and photoresist 34 are removed.

Using the remaining hard mask film 32 and TEOS-SiO$_2$ film 31 as a mask, trenches 35, each having a width of 30 nm to 130 nm and a depth of about 250 nm, are formed by, e.g. RIE, in the silicon nitride film 30, silicon oxide film 12 and silicon substrate 11.

The trenches 35 form a pillar FIN (FIN <12>) on the major surface of the silicon substrate 11, as shown in FIGS. 10A to 10D. The width of the pillar FIN is, e.g. about 20 nm to 110 nm.

Figure 1:
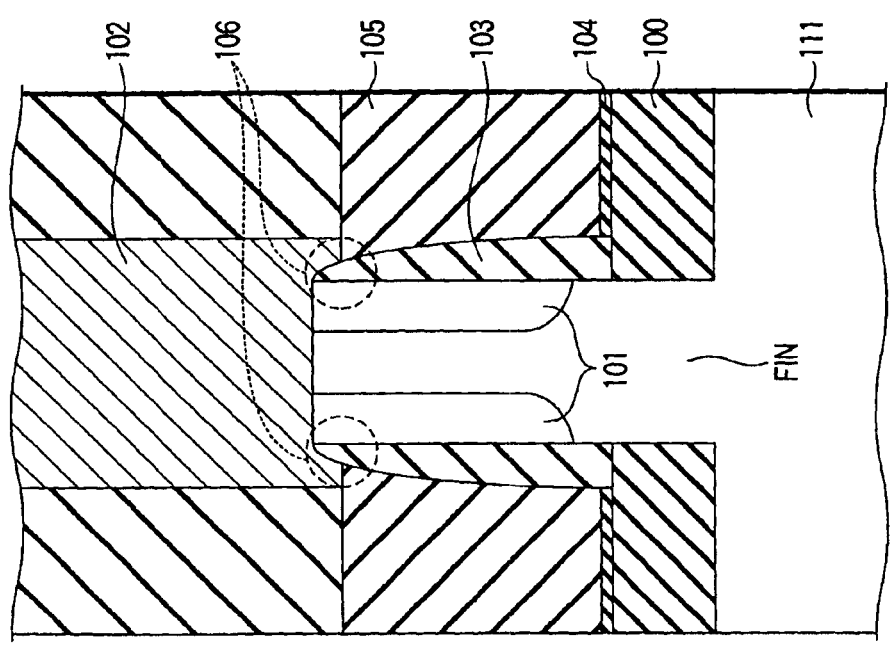
FIG. 1 is a cross-sectional view schematically showing a contact area between a source region formed in a pillar and a surface strap, the contact area being a problem in the prior art.

Subsequently, an oxide film is formed by, e.g. thermal oxidation, on an inner wall of the trench 35. Then, SiO$_2$ is buried by, e.g. CVD, and the surface of the resultant structure is flattened by CMP (Chemical Mechanical Polishing). Through the above steps, a silicon oxide film 36, which becomes a device isolation region, is buried in the trench 35, as shown in FIGS. 11A to 1D.

The silicon oxide film 36 of the memory cell array, as shown in FIGS. 12A to 12D, is then etched back by about 150 nm by, e.g. a wet etching method. At this time, the thickness of the silicon oxide film 36 remaining on the bottom of the trench is, e.g. about 30 nm.

With ion implantation, boron (B), for instance, is obliquely implanted twice in different directions into the side wall of the silicon substrate 11 above the silicon oxide film 36 of the memory cell array. Further, the resultant is nitrided in a nitrogen atmosphere or a plasma atmosphere and then annealed. Thereafter, a gate insulation film Gox with a thickness of about 5 nm is formed by, e.g. thermal oxidation (not shown). As is shown in FIG. 13A to FIG. 13D, a polysilicon layer 38, which becomes a gate electrode G, is deposited in the etched-back trench. The polysilicon layer 38 is then flattened by, e.g. CMP, using the silicon nitride film 30 as a stopper.

Next, as shown in FIG. 14A to FIG. 14D, an oxide film is formed on the entire surface of the silicon substrate 11 in a low-pressure atmosphere in which O$_2$ and H$_2$, for instance, are burnt, or in an ozone-containing atmosphere. Further, a silicon nitride film 40 with a thickness of about 100 nm, a BSG film 41 with a thickness of about 1600 nm, which becomes a mask material, a hard mask film 42 with a thickness of about 700 nm, and a SOG film 43 with a thickness of about 10 nm are formed in succession. Over the SOG film 43, a photoresist 44 is coated. The photoresist 44 is exposed and developed to have a mask pattern for forming a deep trench. The hard mask film 42 and SOG film 43 are formed to exactly etch the BSG film 41.

Using the photoresist 44 as a mask, the SOG film 43, hard mask film 42, BSG film 41, silicon nitride film 40, silicon nitride film 30 and silicon oxide film 12 are successively etched. Thus, a trench 45 serving as a mask for forming a deep trench is formed. Following this step, the photoresist 44 and SOG film 43 are removed, as shown in FIG. 15A to FIG. 15D. In this step, since the oxide film (not shown) is present between the silicon nitride film 30 and silicon nitride film 40, the silicon nitride film 40 alone can be selectively removed.

Next, as shown in FIG. 16A to FIG. 16D, the polysilicon layer 38 and silicon oxide film 36 of the memory cell array are etched by, e.g. a low-selectivity etching method.

Subsequently, as shown in FIG. 17A to FIG. 17D, the silicon substrate 11 is etched by, e.g. RIE, and a deep trench 46 is formed. Further, post-cleaning is carried out. The depth of the deep trench 46 is, e.g. about 6 µm.

Then, as shown in FIG. 18A to FIG. 18D, the hard mask film 42 and BSG film 41 are removed. In addition, the entire polysilicon layer 38 is oxidized. Thereafter, the silicon substrate 11 is thermally oxidized at, e.g. about 1100° C., thus forming an oxide film in the trench 46. Further, a silicon nitride film is formed in the trench 46, and a silicon nitride film (not shown) above the trench 46 is removed. Then, again, a collar insulation film 47 is selectively formed on only a part where the silicon nitride film is removed by thermal oxidation. The final thickness of the collar insulation film 47 is, e.g. about 25 nm to 30 nm. Through this step, the thickness of the collar insulation film 47 can be controlled at a desired value.

In the following step shown in FIG. 19A to FIG. 19D, a bottom portion 48 of the deep trench 46 is etched by, e.g. chemical dry etching by an amount of about 30 nm, and thus broadened. Further, As (arsenic) or P (phosphorus) is adsorbed and diffused in the deep trench 46 by a vapor phase reaction. Thus, an N+ diffusion region 49 (plate electrode) is formed in the silicon substrate 11. Subsequently, a capacitor insulation film is formed along the inner wall of the bottom portion 48 of the deep trench 46. A polysilicon layer 50 (storage electrode) is then buried in the deep trench 46. The upper surface of the resultant structure is flattened by, e.g. CMP.

In the next step shown in FIG. 20A to FIG. 20D, the polysilicon layer 50 is etched back by an amount of about 50 nm by, e.g. RIE. In the etched-back recess, a buried insulation film 51 of TEOS-$SiO_2$ with a thickness of 200 nm is deposited by CVD using, e.g. TEOS as a reaction gas. Thereafter, part of the buried insulation film 51 and the silicon nitride film 40 are removed by, e.g. CMP, and the surface of the resultant structure is flattened until the upper surface of the polysilicon layer 38 appears.

In the subsequent step illustrated in FIG. 21A to FIG. 21D, a polysilicon layer 52 is deposited to a thickness of about 70 nm over the entire surface. By ion implantation, B (boron), for instance, is doped in the polysilicon layer 52 under the condition of $2\times10^{15}/cm^3$ at 5 keV. On the polysilicon layer 52, a BSG film 53 serving as a cap layer is deposited to a thickness of about 150 nm.

As is shown in FIG. 22A to FIG. 22D, a photoresist is coated on the BSG film 53, and the photoresist is exposed and developed to have a desired pattern (not shown). Using the photoresist as a mask, RIE, for example, is performed to successively etch the BSG film 53, polysilicon layer 52 and polysilicon layer 38 so as to leave the polysilicon layer 38 only in the device region. The device isolation region 5, where the polysilicon layer 38 has been removed, becomes an isolation portion for isolating trench capacitors TC which are adjacent along a bit line BL to be formed later.

Impurity ions of a conductivity type opposite to the conductivity type of the silicon substrate 11, such as ions of phosphorus (P) or arsenic (As), are doped in the substrate 11 by ion implantation. By annealing and diffusing the impurity ions, a source region S and a drain region D, which are activation regions of the transistor TR, are formed.

Next, as shown in FIGS. 23A to 23D, an SOG film 70 (a coat-type oxide film), for instance, is formed on the entire surface by, e.g. a coating method. In this step, the SOG film 70 is completely buried at the side walls of the pillar FIN in which source regions S are formed.

In the following step shown in FIG. 24A to FIG. 24D, the SOG film 70 is etched back to the surface of the silicon nitride film 30 by, e.g. wet etching.

Then, as shown in FIG. 25A to FIG. 25D, a TEOS film 72 is deposited on the entire surface by, e.g. LP-CVD (Low-Pressure CVD).

Thereafter, the entire surface is etched back by, e.g. RIE, as shown in FIG. 26A to FIG. 26D. In this step, a spacer 73 formed of an oxide film is provided on the side wall of the gate electrode.

Further, as shown in FIG. 27A to 27D, etching is continued by, e.g. RIE, with the time, etc. being controlled. In this step, since the etching is carried out using the spacer 73 as a mask, the silicon nitride film 30 and buried insulation film 51 are etched back in a self-alignment manner, with the spacer 73 left on the side wall of the gate electrode.

Etching is further carried out by, e.g. RIE, as shown in FIG. 28A to FIG. 28D. Thereby, the silicon oxide film 12 on the upper part of the pillar FIN, which becomes the drain region D and source region S, is removed and the upper part of the SOG film 70 on the side surface of the pillar FIN is etched back. Through this step, the upper part and side wall 71 of the pillar FIN, which become the source region S, are exposed.

In the next step illustrated in FIG. 29A to 29D, amorphous silicon 74 doped with P-type impurities is deposited by, e.g. CVD to a thickness of, e.g. about 2200 Å.

The surface of the amorphous silicon 74 is flattened by, e.g. CMP, as shown in FIG. 30A to FIG. 30D.

Subsequently, as shown in FIG. 31A to FIG. 31D, a photoresist 75 is coated, exposed and developed, and thus the photoresist 75 is patterned to remain on the activation regions.

Using the photoresist 75 as a mask, the amorphous silicon 74 is etched by, e.g. RIE. Then, as shown in FIG. 32A to FIG. 32D, the photoresist 75 is removed. Through the above steps, surface straps SS (SS<03>, SS<12>, SS<23>) are formed. In the above steps, the surface strap SS (SS<12>) is formed so as to contact the upper surface and side surface of the pillar FIN in which the source region S (S<12>) is formed.

In the following step illustrated in FIG. 33A to FIG. 33D, an SOG film 65 is formed on the entire surface by, e.g. a coating method. The SOG film 65 is then flattened by, e.g. CMP. In this step, the SOG film 65 may be replaced with, e.g. a BPSG film.

Then, as shown in FIG. 34A to FIG. 34D, a TEOS film 76 is deposited over the entire surface by, e.g. CVD. Further, a contact hole is formed in the TEOS film 76 formed on the drain region D (D<03>, D<04>) by, e.g. RIE. In the contact hole, W (tungsten), for instance, is buried to form a bit line contact BC (BC <03>). A bit line BL is formed on the TEOS film 76. The bit line BL is electrically connected to the drain region D of the MOSFET TR via the bit line contact BC.

Through the above fabrication process, the DRAM shown in FIG. 2 to FIG. 7 is formed.

According to the above process, as shown in FIG. 28A to FIG. 28D, further etching is conducted by, e.g. RIE. Thereby, the silicon oxide film 12 on the upper part of the pillar FIN, which becomes the drain region D and source region S, is removed and the upper part of the SOG film 70 on the side surface of the pillar FIN is etched back. Through this step, the upper part and side wall 71 of the pillar FIN, which become the source region S, can be exposed. Thus, the insulation film on the side wall 71 of the pillar FIN can be removed.

In addition, as shown in FIG. 31A to FIG. 31D, the photoresist 75 is coated, exposed and developed, and thus the photoresist 75 is patterned to remain on the activation regions. Through this step, the surface straps SS can be formed using the line-and-space photoresist pattern. Therefore, the mask formation becomes simple, and the manufacturing cost can be reduced.

As shown in FIG. 23A to FIG. 23D, the SOG film 70, for instance, is formed on the entire surface by, e.g. a coating method, and the SOG film 70 is completely buried on the side walls of the pillar FIN in which source regions S are formed. In this step, the SOG film 70 can completely be buried at the side walls of the pillar FIN in which source regions S are formed. Thus, in the subsequent step of forming the spacer 73 that becomes the side wall, the TEOS film 72 does not reach the side wall 71 of the pillar FIN in which the source region is formed. Therefore, the TEOS film 72 can be prevented from remaining on the side portion 71 of the pillar FIN.

The use of the oxide film formed by the coating method, as mentioned above, realizes flat formation, regardless of the pattern of the gate contact (the pattern of the polysilicon layer 52 and BPSG film 53). The aforementioned SOG film 70 may be replaced with a coat-type oxide film such as an $SiO_2$ film formed by coating, or an $SiO_2$ film formed by CVD.

In the above-described embodiment, the pillar FIN for forming the fin-gate-type MOSFET is first formed, and then the trench capacitor TC is formed. Thus, a sufficiently large depth of etching of the polysilicon layer 50 can be achieved by controlling the time, temperature, etc. for etching. The depth of etching corresponds to a thickness of the buried insulation film 51 which is formed in a later step. According to the fabrication method of this embodiment, the thickness of the buried insulation film 51 can freely be set at a desired value.

[Second Embodiment]

Figure 35:
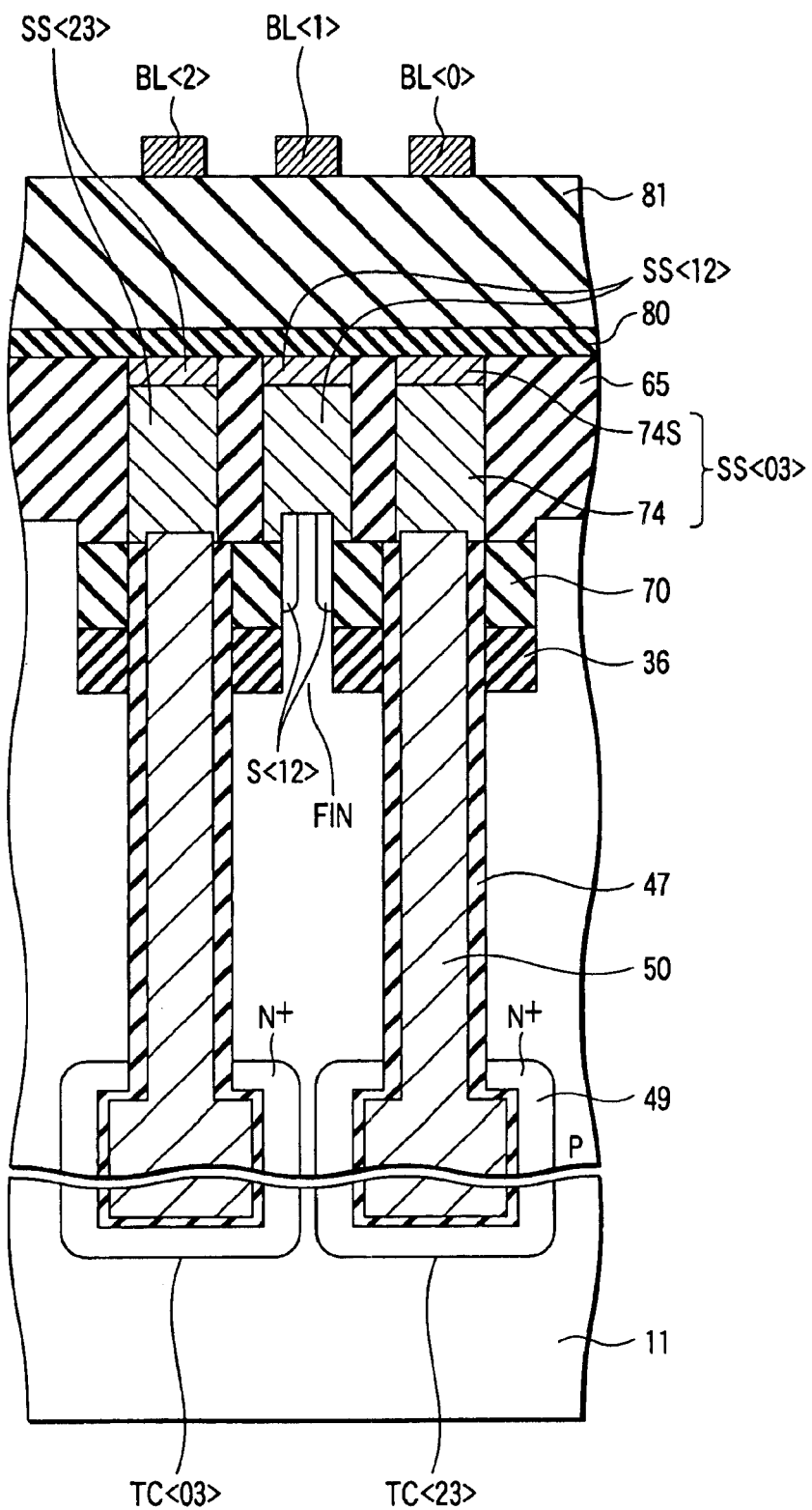
FIG. 35 is a view for describing a semiconductor memory device according to a second embodiment of the present invention, FIG. 35 being a cross-sectional view taken along a line parallel to word lines of DRAM cells.
Figure 36:
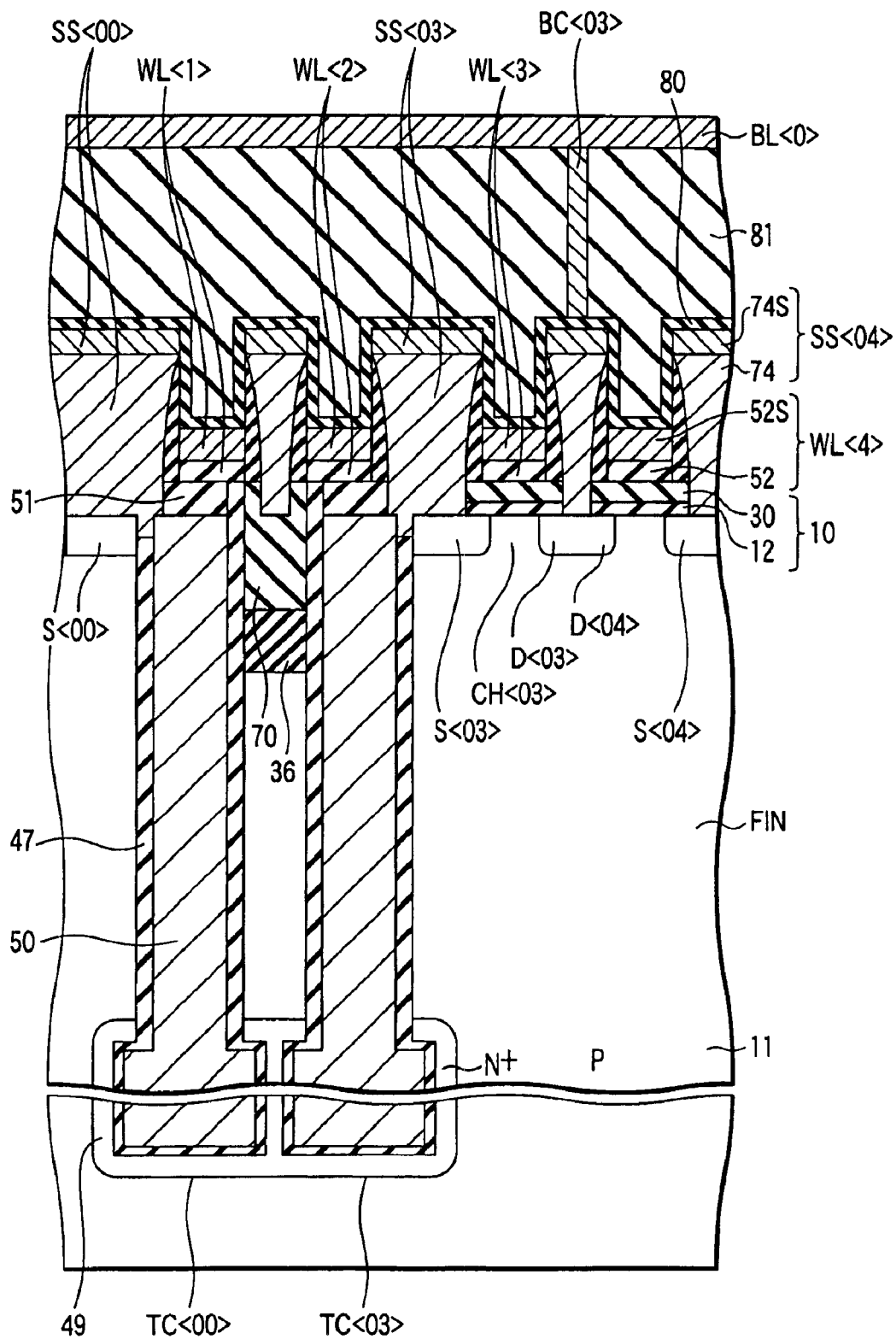
FIG. 36 is a view for describing the semiconductor memory device according to the second embodiment of the present invention, FIG. 36 being a cross-sectional view taken along a line parallel to bit lines of DRAM cells.

A cross-sectional structure of a DRAM according to a second embodiment of the present invention will now be described with reference to FIG. 35 and FIG. 36. FIG. 35 shows a cross section through the same line of direction as in FIG. 5, and FIG. 36 shows a cross section through the same line as in FIG. 6. In the description below, the parts common to those in the first embodiment are not described.

As is shown in FIG. 35 and FIG. 36, a silicide film 74S is formed on the amorphous silicon 74. A silicide film 52S is formed on the polysilicon layer 52, as shown in FIG. 36. In addition, a barrier silicon nitride film 80 is formed over the entire lower surface of the BPSG film 81.

The silicide film 74S is formed on the amorphous silicon 74, as mentioned above. The silicide film 52S is formed on the polysilicon layer 52. With this structure, the contact resistance value of the surface strap SS can further be reduced.

Besides, the barrier silicon nitride film 80 is formed on the entire lower surface of the BPSG film 81. Therefore, the insulation in the entirety of the memory cell array is enhanced, and the reliability of the memory cells is increased.

A fabrication method of the semiconductor memory device according to the second embodiment of the present invention will now be described, referring to, by way of example, a fabrication method of the memory cell having the fin-gate-type MOSFET and trench capacitor shown in FIGS. 35 and 36. In the description below, FIG. 37A to FIG. 43A, FIG. 37B to FIG. 43B, FIG. 37C to FIG. 43C and FIG. 37D to FIG. 43D will be referred to.

FIGS. 37A through 43A show cross sections through the same line of direction as in FIG. 8A through 34A, illustrating fabrication steps in succession. FIGS. 37D through 43B show cross sections through the same line as in FIG. 8B through 34B, illustrating fabrication steps in succession. FIGS. 37C through 43C show cross sections through the same line as in FIG. 8C through 34C, illustrating fabrication steps in succession. FIGS. 37D through 43D show cross sections through the same line as in FIGS. 8D through 34D, illustrating fabrication steps in succession. In the description below, the parts common to those in the first embodiment are not described.

As is shown in FIG. 37A to FIG. 37D, like the same fabrication step as in the first embodiment, an amorphous silicon 74 that becomes a surface strap SS is formed to contact the side surface and upper surface of the pillar FIN. Further, an SOG film 65 is formed over the entire surface by, e.g. a coating method. Then, the SOG film 65 is flattened by, e.g. CMP. In this step, the SOG film 65 may be replaced with, e.g. a BPSG film.

In the following step shown in FIG. 38A to 38D, the BPSG film 53 formed on the polysilicon layer 52 that becomes a word line is selectively removed by, e.g. hot phosphoric acid.

A Co/Ti/TiN film 77 is deposited over the entire surface by, e.g. sputtering, as shown in FIG. 39A to FIG. 39D. The Co/Ti/TiN film 77 is, e.g. about 120/200/200 Å thick, respectively.

Then, as is shown in FIG. 40A to FIG. 40D, heat treatment, for instance, is conducted to selectively form a silicide film 52S and a silicide film 74S on the polysilicon layer 52, which becomes the word line, and on the amorphous silicon 74. Thereafter, the Co/Ti/TiN film 77 deposited on the SOG film 65 is selectively removed by, e.g. wet etching.

Subsequently, as shown in FIG. 41A to FIG. 41D, a barrier silicon nitride film 80 is deposited over the entire surface by, e.g. CVD. The thickness of the barrier silicon nitride film 80 is, e.g. about 150 Å. Then, a BPSG film 81 is deposited over the entire surface by, e.g. CVD.

The deposited BPSG film 81 is flattened by, e.g. CMP, as shown in FIG. 42A to FIG. 42D.

Following the above, as shown in FIG. 43A to FIG. 43D, a contact hole is formed in the barrier silicon nitride film 80 and BPSG film 81 so as to reach the silicide film 74S formed on the drain region D (D <03>, D<04>) by, e.g. RIE. For instance, W (tungsten) is buried in the contact hole, thus forming a bit line contact BC (BC<03>). A bit line BL is formed on the TEOS film 76. The bit line BL is electrically connected to the drain region D of the MOSFET TR via the bit line contact BC.

Through the above-described fabrication process, the DRAM shown in FIGS. 35 and 36 is obtained.

In the above process, as shown in FIG. 40A to FIG. 40D, heat treatment, for instance, is conducted to selectively form the silicide film 525 and silicide film 74S on the polysilicon layer 52, which becomes the word line, and on the amorphous silicon 74. By this step, the silicide film 52S and silicide film 74S can selectively be formed at the same time on the polysilicon layer 52 and the amorphous silicon 74. Therefore, the manufacturing cost can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device including memory cells each having a trench capacitor and a fin-gate-type MOSFET that selects the trench capacitor, comprising:

a pillar formed on a major surface of a semiconductor substrate;

a device isolation region formed on the semiconductor substrate in a vicinity of a proximal portion of the pillar;

a gate electrode functioning as a word line, the gate electrode being formed on a side wall and an upper surface of the pillar;

a gate insulation film interposed between the pillar and the gate electrode;

a first activation region formed in the pillar and connected to a bit line;

a second activation region formed in the pillar and spaced apart from the first activation region such that the gate electrode is interposed between the second activation region and the first activation region;

a first oxide film formed on a side wall of the gate electrode, which corresponds to an upper surface of the pillar;

a trench formed in a vicinity of the second activation region in the pillar;

a capacitor formed on a side wall portion of the trench;

a second oxide film formed on the device isolation region at an upper part of the side wall of the pillar such that the second oxide film is located lower than the upper surface of the pillar; and a surface strap formed on the second oxide film at a position above the second activation region in the pillar, the surface strap electrically connecting the second activation region and one of electrodes of the capacitor, wherein insulation of the side wall of the gate electrode is effected by the first oxide film alone, insulation between the gate electrode and the surface strap is effected by the second oxide film alone, and contact between the surface strap and the second activation region is made at the upper surface and the side wall of the pillar.

2. The semiconductor memory device according to claim 1, further comprising a third oxide film buried at a side wall portion of the surface strap and formed of the same material as the second oxide film.

3. The semiconductor memory device according to claim 1, further comprising an insulation film buried at a side wall portion of the surface strap and formed of a material different from a material of the second oxide film.

4. The semiconductor memory device according to claim 1, further comprising a silicide layer formed on the gate electrode and the surface strap.

5. The semiconductor memory device according to claim 1, wherein the word line is provided in a transverse direction of the pillar, and the bit line is provided in a direction crossing the word line.

6. The semiconductor memory device according to claim 1, wherein the memory cells are arranged such that a pair of said MOSFETs and a pair of said trench capacitors are disposed adjacent to each other, and the paired MOSFETs and the paired trench capacitors are alternately arranged in a staggered fashion.

* * * * *